US012765197B2

(12) United States Patent
Oh et al.

(10) Patent No.: US 12,765,197 B2
(45) Date of Patent: Oct. 13, 2026

(54) DISPLAY DEVICE

(71) Applicant: Samsung Display Co., Ltd., Yongin-Si (KR)

(72) Inventors: Eon Seok Oh, Yongin-si (KR); Jungjoon Seo, Yongin-si (KR); Taehyun Sung, Yongin-si (KR); Je-Hyun Song, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 402 days.

(21) Appl. No.: 18/513,225

(22) Filed: Nov. 17, 2023

(65) Prior Publication Data

US 2024/0284732 A1 Aug. 22, 2024

(30) Foreign Application Priority Data

Feb. 22, 2023 (KR) ........................ 10-2023-0023471

(51) Int. Cl.

| | |
|---|---|
| ***H10K 59/131*** | (2023.01) |
| ***G09G 3/3233*** | (2016.01) |
| ***H10K 59/122*** | (2023.01) |

(52) U.S. Cl.

CPC ......... *H10K 59/131* (2023.02); *G09G 3/3233* (2013.01); *H10K 59/122* (2023.02); *G09G 2300/0819* (2013.01); *G09G 2300/0852* (2013.01); *G09G 2300/0861* (2013.01)

(58) Field of Classification Search

CPC .... H10K 59/131; H10K 59/122; H10K 59/65; H10K 59/121; H10K 59/126; H10K 59/80515; H10K 59/123; H10K 59/12; H10K 59/35; H10K 59/124; H10K 59/60; H10K 59/80521; H10K 59/8792; H10K 2102/351; G09G 3/3233; G09G 2300/0819; G09G 2300/0852; G09G 2300/0861

See application file for complete search history.

(56) References Cited

U.S. PATENT DOCUMENTS

| | | | | |
|---|---|---|---|---|
| 10,453,905 | B2 | 10/2019 | An et al. | |
| 2022/0149129 | A1 | 5/2022 | Park et al. | |
| 2022/0231093 | A1 | 7/2022 | Zhang et al. | |
| 2022/0384544 | A1 | 12/2022 | An et al. | |
| 2022/0406877 | A1 * | 12/2022 | Cha ...................... | H10K 59/121 |
| 2024/0040894 | A1 | 2/2024 | Jin et al. | |

FOREIGN PATENT DOCUMENTS

| | | | |
|---|---|---|---|
| CN | 114512520 | A | 5/2022 |

* cited by examiner

*Primary Examiner* — Anne M Hines
*Assistant Examiner* — Jose M Diaz
(74) *Attorney, Agent, or Firm* — Innovation Counsel LLP

(57) ABSTRACT

A display device includes a display panel that has a first region, a second region adjacent to the first region, and a third region adjacent to the second region. The display panel includes a base layer, a first pixel including a first emission element in the first region and a first pixel circuit in the second region, a metal layer disposed between the base layer and the first emission element a second pixel in the second region, and a third pixel in the third region. The first emission element includes a first pixel electrode, a first emission layer on the first pixel electrode, and a common electrode on the first emission layer. The first pixel electrode extends beyond an edge of the metal layer.

20 Claims, 24 Drawing Sheets

DISPLAY DEVICE

CROSS-REFERENCE TO RELATED APPLICATION

This U.S. nonprovisional application claims priority under 35 U.S.C § 119 to Korean Patent Application No. 10-2023-0023471 filed on Feb. 22, 2023 in the Korean Intellectual Property Office, the disclosure of which is hereby incorporated by reference in its entirety.

BACKGROUND

The present disclosure relates to a display device.

An electronic apparatus may include a display panel that displays an image and an electronic module that performs various functions including sending control signals to the display panel. The display panel may include emission elements that generate light. The emission elements may produce and display an image.

The electronic module may include a camera, an infrared sensor, or a proximity sensor. The electronic module may be disposed below the display panel. The display panel may have a high transmittance at a portion and a low transmittance at another portion. The electronic module may receive or output an optical signal through the high transmittance portion of the display panel.

SUMMARY

An embodiment of the present disclosure provides a display device capable of increasing reliability by preventing damage to elements.

According to an embodiment of the present disclosure, a display device may comprise a display panel that has a first region, a second region adjacent to the first region, and a third region adjacent to the second region. The display panel may include: a baser layer; a first pixel disposed on the baser layer, the first pixel including a first emission element disposed in the first region and a first pixel circuit disposed in the second region, and the first pixel circuit being connected to the first emission element; a metal layer disposed between the base layer and the first emission element; a second pixel on the second region; and a third pixel on the third region. The first emission element may include: a first pixel electrode; a first emission layer on the first pixel electrode; and a common electrode on the first emission layer. The first pixel electrode extends beyond an edge of the metal layer.

In an embodiment, in plan view, the metal layer may overlap the first pixel electrode.

In an embodiment, the common electrode may be shared between the second and third pixels. An opening may be defined in the common electrode in the first region.

In an embodiment, the first pixel electrode may be closer than the metal layer to the opening.

In an embodiment, a width of the first emission layer may be less than the width of the metal layer.

In an embodiment, when viewed in plan, the first emission layer may overlap the metal layer and may be disposed in the metal layer.

In an embodiment, the display device may further comprise a pixel definition pattern that covers an edge of the first pixel electrode and has a ring shape in plan view. The first emission layer may be in an opening of the pixel definition pattern. The common electrode may be on the pixel definition pattern.

In an embodiment, in plan view, an outer boundary of the first pixel electrode may be between an outer boundary of the metal layer and an outer boundary of the pixel definition pattern.

In an embodiment, the common electrode may cover the pixel definition pattern and extend to an edge of an opening defined in the common electrode.

In an embodiment, the second pixel may include: a second emission element on the second region; and a second pixel circuit on the second region and connected to the second emission element. The third pixel may include: a third emission element on the third region; and a third pixel circuit on the third region and connected to the third emission element.

In an embodiment, an area of the first pixel electrode of the first emission element may be greater than an area of the third pixel electrode of the third emission element.

In an embodiment, an area of the second pixel electrode of the second emission element may be greater than an area of the third pixel electrode of the third emission element.

In an embodiment, the display device may further comprise a connection line between the first pixel electrode and the metal layer on the first region to be connected to the first pixel. The connection line may extend toward the second region to be connected to the first pixel circuit. The connection line may include an optically transmissive material.

In an embodiment, the display device may further comprise a color filter on the first emission element.

In an embodiment, the first pixel electrode may include: a first sub-pixel electrode on the metal layer; and a second sub-pixel electrode in contact with an edge of the first sub-pixel electrode. The first sub-pixel electrode may extend beyond the metal layer in plan view.

In an embodiment, the display device may further comprise: a first pixel definition pattern on a portion of the first pixel electrode that is adjacent to an edge of the first pixel electrode; and a second pixel definition pattern that extends from the first pixel definition pattern toward the edge of the first pixel electrode to cover the edge of the first pixel electrode. The second pixel definition pattern may have a thickness less than a thickness of the first definition pattern.

In an embodiment, the display device may further comprise: a pixel definition pattern on a portion of the first pixel electrode adjacent to an edge of the first pixel electrode; and a dummy dielectric layer on the pixel definition pattern, the dummy dielectric layer extending toward the edge of the first pixel electrode to cover the edge of the first pixel electrode. The dummy dielectric layer may have a thickness less than a thickness of the pixel definition pattern.

In an embodiment, the display device may further comprise a black matrix on the pixel definition pattern and the dummy dielectric layer. The black matrix may overlap the pixel definition pattern and the dummy dielectric layer.

According to an embodiment of the present disclosure, a display device may comprise a display panel that has a first region, a second region adjacent to the first region, and a third region adjacent to the second region. The display panel may include: a baser layer; a first pixel disposed on the baser layer, the first pixel including a first emission element disposed on the first region and a first pixel circuit disposed on the second region, and the first pixel circuit being connected to the first emission element; a metal layer disposed between the base layer and the first emission element; a second pixel on the second region; and a third pixel on the third region. The first emission element may include: a first pixel electrode; a first emission layer on the first pixel electrode; and a common electrode on the first emission layer. An opening may be defined in the common electrode. The first pixel electrode may be closer than the metal layer to the opening.

According to an embodiment of the present disclosure, a display device may comprise a baser layer comprising a first region, a second region surrounding the first region, and a third region surrounding the second region; a first pixel disposed on the baser layer, the first pixel including a first emission element disposed in the first region and a first pixel circuit disposed in the second region, and the first pixel circuit being electrically connected to the first emission element and including a semiconductor pattern; a second pixel disposed on the baser layer, the second pixel including a second emission element disposed in the second region and a second pixel circuit disposed in the second region, and the second pixel circuit being electrically connected to the second emission element; a third pixel disposed on the baser layer, the third pixel including a third emission element disposed in the third region and a third pixel circuit disposed in the third region, and the third pixel circuit being electrically connected to the third emission element; and a metal layer disposed between the baser layer and the semiconductor pattern. An optical transmittance of the first region may be greater than an optical transmittance of the third region. The first emission element may include a first pixel electrode, a first emission layer disposed on the first pixel electrode and a common electrode disposed on the first emission layer. The first pixel electrode may extend beyond an edge of the metal layer.

DETAILED DESCRIPTION OF EMBODIMENTS

Figure 1:
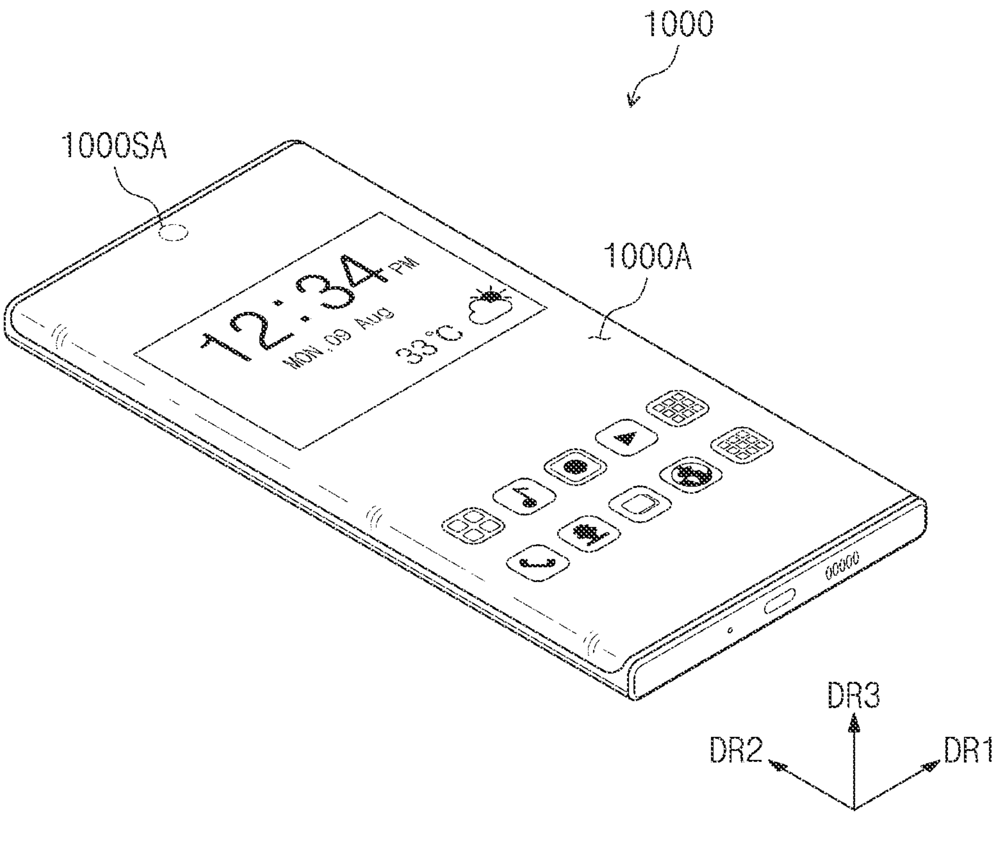
FIG. 1 illustrates a perspective view showing an electronic apparatus according to an embodiment of the present disclosure.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals may indicate like components. Moreover, in the drawings, thicknesses, ratios, and dimensions of components are exaggerated for effectively explaining the technical contents.

The term "and/or" may include one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present disclosure. Unless the context clearly indicates otherwise, the singular forms are intended to include the plural forms as well.

In addition, the terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined, all terms used herein including technical and scientific terms have the same meaning generally understood by one of ordinary skill in the art. Also, terms as defined in dictionaries generally used should be understood as having meanings that are contextually defined in the art and should not be understood as ideally or excessively formal unless clearly defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The following will now describe some embodiments of the present disclosure in conjunction with the accompanying drawings.

FIG. 1 illustrates a perspective view showing an electronic apparatus according to an embodiment of the present disclosure.

Referring to FIG. 1, an electronic apparatus 1000 may be a device activated with an electrical signal. For example, the electronic apparatus 1000 may be a mobile phone, a tablet computer, a monitor, a television set, an automotive navigation system, a game console, or a wearable apparatus, but the present disclosure is not limited thereto. FIG. 1 depicts by way of example a mobile phone as the electronic apparatus 1000.

The electronic apparatus 1000 may display an image through a display region 1000A. The display region 1000A may include a plane defined by a first direction DR1 and a second direction DR2 that intersects the first direction DR1.

The display region 1000A may further include curved surfaces that are bent from at least two sides of the plane. However, the shape of the display region 1000A is not limited thereto. For example, the display region 1000A may include only the plane, or may further include a plurality of curved surfaces that connect at least two sides of the electronic apparatus 1000. For example, in the embodiment depicted in FIG. 1, the display region 1000A includes four curved surfaces positioned along each side of the generally rectangular front surface.

A sensing region 1000SA may be defined in the display region 1000A of the electronic apparatus 1000. FIG. 1 depicts, by way of example, one sensing region 1000SA, but the number of the sensing region 1000SA is not limited thereto. The sensing region 1000SA may be a portion of the display region 1000A. Therefore, the electronic apparatus 1000 may display an image through the sensing region 1000SA. The sensing region 1000SA may have an optical transmittance greater than that of another portion of the display region 1000A.

The electronic apparatus 1000 may include an electronic module disposed on a portion that overlaps the sensing region 1000SA. The electronic module may receive external inputs through the sensing region 1000SA or may provide outputs through the sensing region 1000SA. For example, the electronic module may be a camera module, a sensor such as a proximity sensor that measures a distance, a sensor that recognizes a part of user's body (e.g., fingerprint, iris, or face for authentication purposes), or a compact-sized lamp that outputs light, but the present disclosure is not particularly limited thereto.

A thickness direction of the electronic apparatus 1000 may be defined as a third direction DR3 that intersects the first direction DR1 and the second direction DR2. Therefore, the third direction DR3 may be used as a reference to define front and rear surfaces (or top and bottom surfaces) of each of members that constitute the electronic apparatus 1000.

Figure 2:
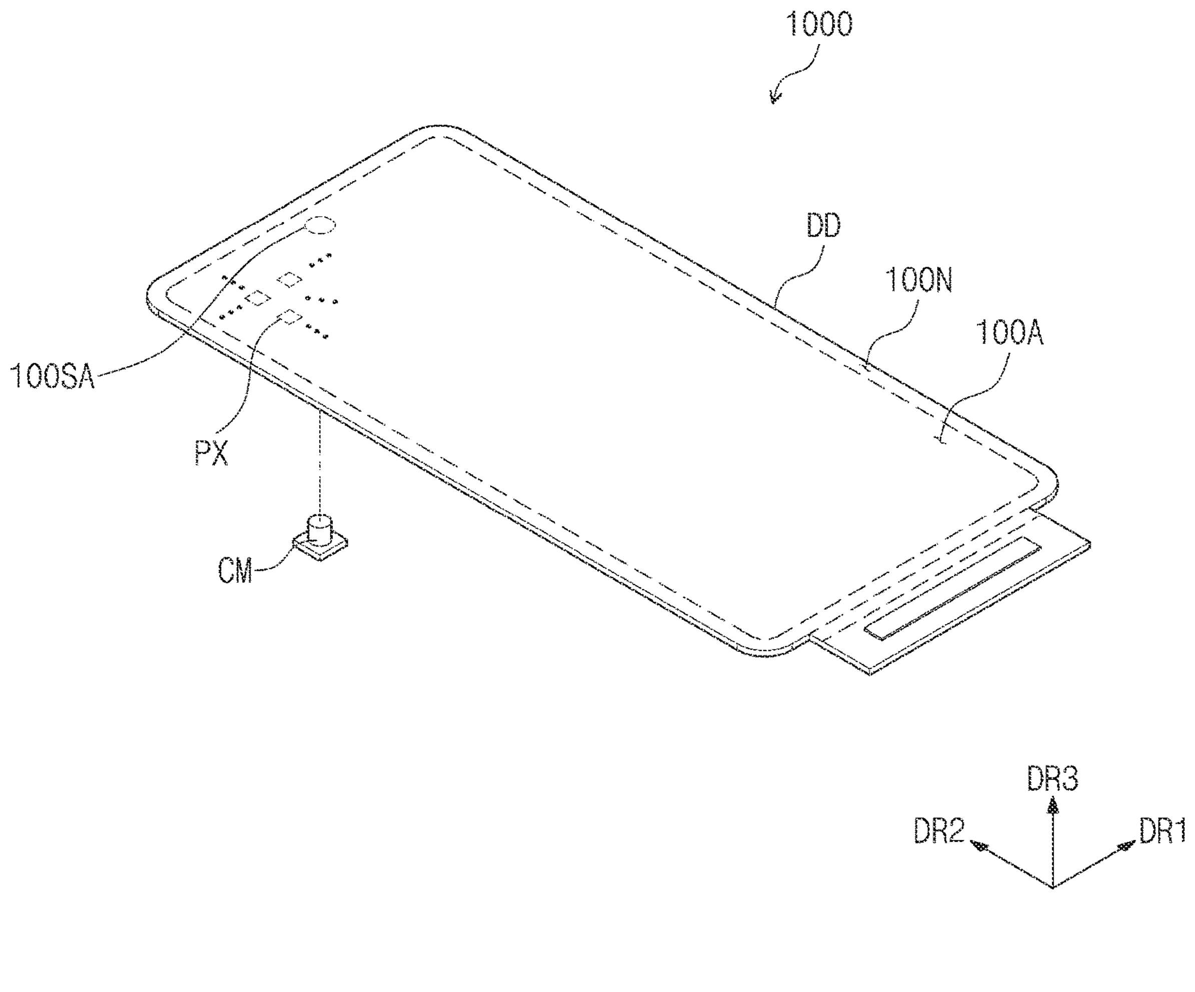
FIG. 2 illustrates an exploded perspective view showing some components of an electronic apparatus according to an embodiment of the present disclosure.

FIG. 2 illustrates an exploded perspective view showing some components of an electronic apparatus according to an embodiment of the present disclosure.

Referring to FIG. 2, the electronic apparatus 1000 may include a display device DD and an electronic module CM. The display device DD may generate an image and detect an input that is externally applied. The electronic module CM may be disposed below the display device DD, and for example, may be a camera module or an infrared sensor module. When the display device DD is defined as a first electronic module that constitutes the electronic apparatus 1000, the electronic module CM may be defined as a second electronic module.

The display device DD may include a display region 100A and a peripheral region 100N that are defined thereon. The display region 100A may correspond to the display region 1000A depicted in FIG. 1. A partial region of the display device DD may be defined as a sensing region 100SA, and the sensing region 100SA may have a higher transmittance than that of another portion of the display region 100A.

The sensing region 100SA may be a portion of the display region 100A. For example, the sensing region 100SA may display an image, and may permit transmission of an external input provided to the electronic module CM and/or an output provided from the electronic module CM. For example, when the electronic module CM is a camera module, the sensing region 100SA may provide the electronic module CM with natural light.

A plurality of pixels PX may be disposed on the display region 100A. The display region 100A may include emission elements of the pixels PX, and the peripheral region 100N may not include emission elements. The pixels PX may be disposed on the sensing region 100SA and a primary display region.

Figure 3:
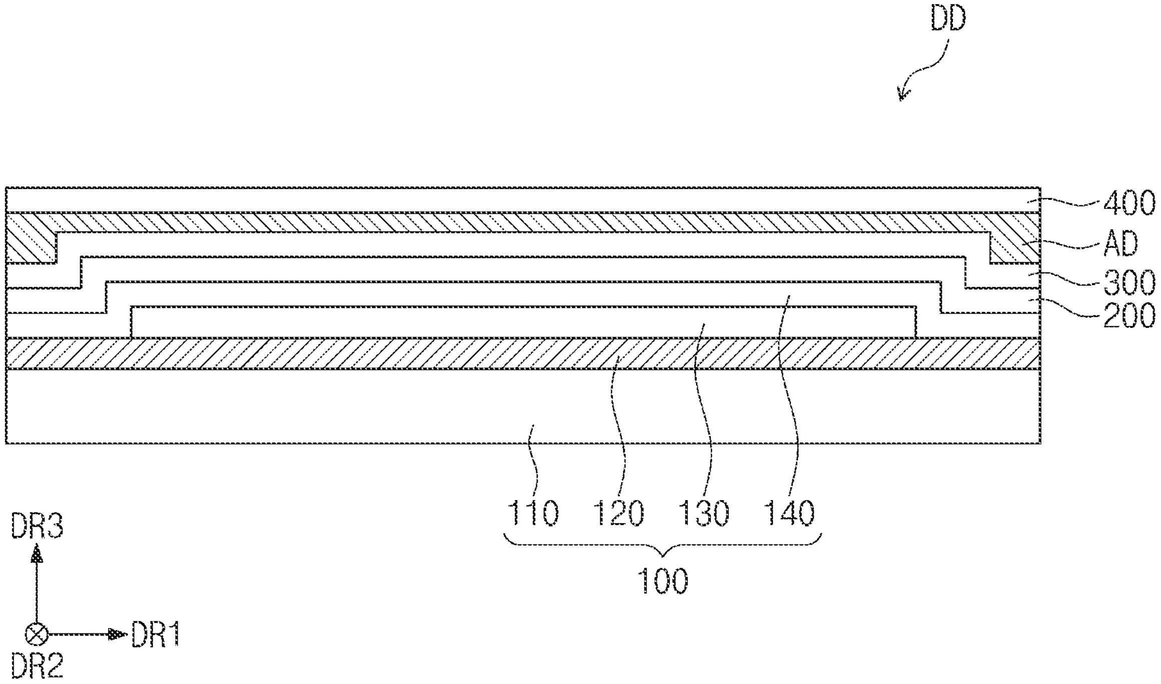
FIG. 3 illustrates a cross-sectional view showing a display device according to an embodiment of the present disclosure.

FIG. 3 illustrates a cross-sectional view showing a display device according to an embodiment of the present disclosure.

Referring to FIG. 3, the display device DD may include a display panel 100, a sensor layer 200, an antireflection layer 300, and a window 400. The antireflection layer 300 and the window 400 may be coupled through an adhesion layer AD.

The display panel 100 may create an image. The display panel 100 may be an emissive display panel, for example, an organic light-emitting display panel, an inorganic light-emitting display panel, a quantum dot display panel, a micro-LED display panel, or a nano-LED display panel. The display panel 100 may be called a display layer.

The display panel 100 may include a base layer 110, a circuit layer 120, an emission element layer 130, and an encapsulation layer 140. The base layer 110 may provide a base surface on which the circuit layer 120 is disposed. The base layer 110 may be a rigid substrate or a flexible substrate that can be bendable, foldable, or rollable. The base layer 110 may be a glass substrate, a metal substrate, or a polymer substrate. The present disclosure, however, is not limited thereto, and the base layer 110 may be an inorganic layer, an organic layer, or a composite material layer.

The circuit layer 120 may be disposed on the base layer 110. The circuit layer 120 may include a dielectric layer, a semiconductor pattern, a conductive pattern, and a signal line. Coating and deposition processes may be employed such that a dielectric layer, a semiconductor layer, and a conductive layer may be formed on the base layer 110, and then a photolithography process may be performed several times to selectively pattern the dielectric layer, the semiconductor layer, and the conductive layer. Afterwards, the semiconductor pattern, the conductive pattern, and the signal line may be formed.

The emission element layer 130 may be disposed on the circuit layer 120. The emission element layer 130 may include an emission element. For example, the emission element may include an organic light-emitting material, an inorganic light-emitting material, an organic-inorganic light-emitting material, a quantum dot, a quantum rod, a micro-LED, or a nano-LED.

The encapsulation layer 140 may be disposed on the emission element layer 130. The encapsulation layer 140 may protect the emission element layer 130 against moisture, oxygen, and foreign substances such as dust particles. The encapsulation layer 140 may include at least one inorganic layer. The encapsulation layer 140 may include a stack structure in which an inorganic layer, an organic layer, and an inorganic layer are stacked on each other.

The sensor layer 200 may be disposed on the display panel 100. The sensor layer 200 may detect an external input that is applied from the outside. The external input may be a user's input. The user's input may include various types of external input such as a part of user's body, light, heat, pen, and pressure.

A series of processes may be employed to form the sensor layer 200 on the display panel 100. The sensor layer 200 may be directly disposed on the display panel 100. For example, no adhesive member may be separately disposed between the sensor layer 200 and the display panel 100. The present disclosure, however, is not limited thereto, and the sensor layer 200 may be bonded through an adhesive member to the display panel 100. The adhesive member may include an ordinary adhesive or glue.

The antireflection layer 300 may be directly disposed on the sensor layer 200. The antireflection layer 300 may reduce a reflectance of external light that is incident from outside the display device DD. A series of processes may be employed to form the antireflection layer 300 on the sensor layer 200. The antireflection layer 300 may include color filters. The antireflection layer 300 may further include a black matrix adjacent to the color filters. The following will describe a detailed configuration of the antireflection layer 300.

The present disclosure, however, is not limited to the configuration discussed above, and the antireflection layer 300 may include one or more of a retarder and a polarizer to reduce a reflectance of external light. The retarder and the polarizer may collectively achieve a single polarization film. The antireflection layer 300 may further include a protection film disposed on or below the polarization film.

In an embodiment of the present disclosure, the sensor layer 200 may be omitted. In this case, the antireflection layer 300 may be directly disposed on the display panel 100. In an embodiment of the present disclosure, the sensor layer 200 and the antireflection layer 300 may be interchangeably positioned. For example, the antireflection layer 300 may be disposed between the display panel 100 and the sensor layer 200.

Although not shown, in an embodiment of the present disclosure, the display device DD may further include an optical layer disposed on the antireflection layer 300. A series of processes may be employed to form the optical layer on the antireflection layer 300.

The optical layer may control a propagation direction of light incident from the display panel 100 to increase front-side brightness of the display device DD. For example, the optical layer may include an organic dielectric layer having openings defined to correspond to emission regions of pixels included in the display panel 100, and may also include a high-refractive layer that covers the organic dielectric layer and fills the openings. The high-refractive layer may have a refractive index greater than that of the organic dielectric layer.

The window 400 may provide a front surface of the electronic apparatus 1000. The window 400 may protect the display panel 100, the sensor layer 200, and the antireflection layer 300. The window 400 may include a glass film or a synthetic resin film. The window 400 may further include a bezel pattern that overlaps a peripheral region (see DP-NA of FIG. 4) of the display panel 100.

Figure 4:
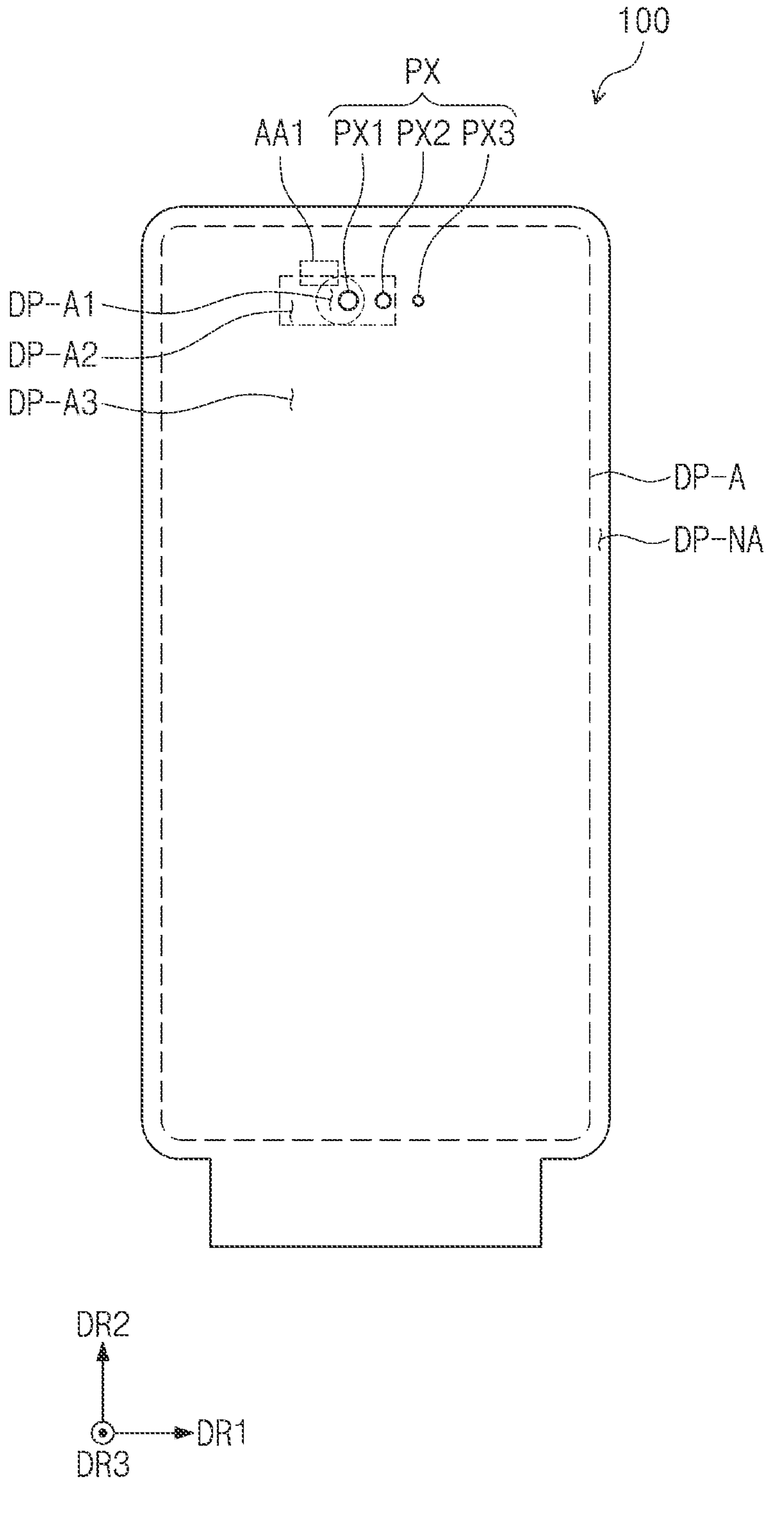
FIG. 4 illustrates a plan view showing a display panel according to an embodiment of the present disclosure.
Figure 5:
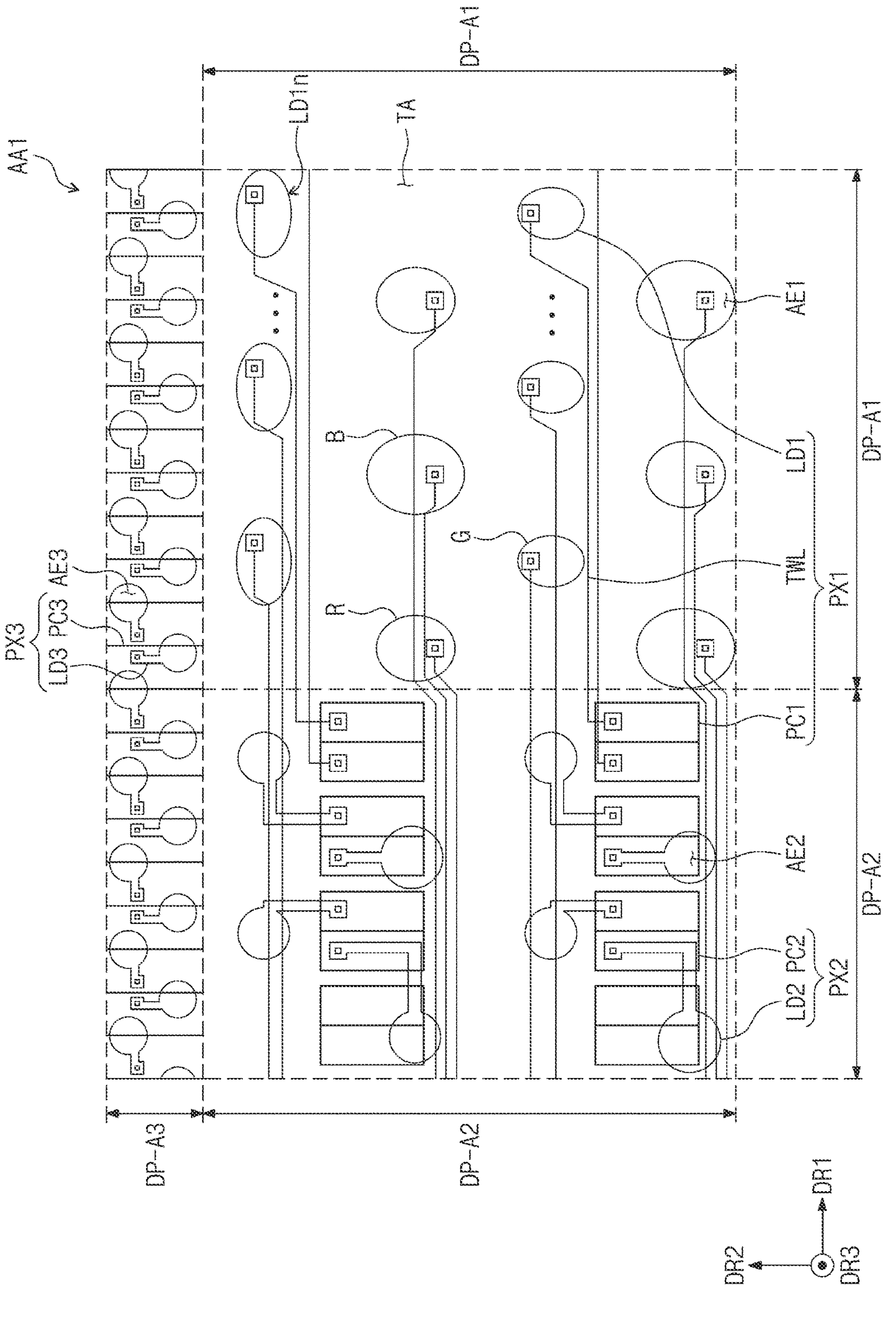
FIG. 5 illustrates an enlarged plan view showing a first region AA1 of FIG. 4.

FIG. 4 illustrates a plan view showing a display panel according to an embodiment of the present disclosure. FIG. 5 illustrates an enlarged plan view showing a first region AA1 of FIG. 4.

Referring to FIGS. 4 and 5, the display panel 100 may include a display region DP-A and a peripheral region DP-NA. The peripheral region DP-NA may be adjacent to the display region DP-A, and may surround at least a portion of the display region DP-A.

The display region DP-A may include a first region DP-A1, a second region DP-A2, and a third region DP-A3. The first region DP-A1 may be called a component region, the second region DP-A2 may be called an intermediate region or a transition region, and the third region DP-A3 may be called a primary display region or a general display region. The first region DP-A1 and the second region DP-A2 may be called an auxiliary display region.

The display panel 100 may include a plurality of pixels PX. The plurality of pixels PX may include a first pixel PX1 that emits light on the first region DP-A1, a second pixel PX2 that emits light on the second region DP-A2, and a third pixel PX3 that emits light on the third region DP-A3.

Each of the first, second, and third pixels PX1, PX2, and PX3 may be provided in plural. In this case, the first, second, and third pixels PX1, PX2, and PX3 may include a red pixel, a green pixel, and a blue pixel, and in an embodiment, may further include a white pixel.

The first pixel PX1 may include a first emission element LD1 and a first pixel circuit PC1 that is connected to and drives the first emission element LD1. The second pixel PX2 may include a second emission element LD2 and a second pixel circuit PC2 that is connected to and drives the second emission element LD2. The third pixel PX3 may include a third emission element LD3 and a third pixel circuit PC3 that is connected to and drives the third emission element LD3.

In FIG. 4, the first pixel PX1, the second pixel PX2, and the third pixel PX3 are illustrated in their positions that correspond to those of the first, second, and third emission elements LD1, LD2, and LD3.

The first region DP-A1 may overlap or correspond to the sensing region 1000SA depicted in FIG. 1. For example, the first region DP-A1 may be provided on a section that overlaps the electronic module (see CM of FIG. 2). An external input (e.g., light) may be provided through the first region DP-A1 to the electronic module CM, and an output from the electronic module CM may be outwardly discharged through the first region DP-A1.

In the present embodiment, although the first region DP-A1 is illustrated by way of example as having a circular shape, the first region A1 may have but is not limited to a polygonal shape, an oval shape, a shape having at least one curved side, a typical shape, or any suitable shapes.

To secure an area of a transmission region TA, the number of pixels may be less on the first region DP-A1 than on the third region DP-A3. On the first region DP-A1, the transmission region TA may be defined to indicate a region where the first emission element LD1 is not disposed. The transmission region TA will be cross-sectionally illustrated in FIG. 7B.

In a unit area or the same area, the number of the first pixels PX1 disposed on the first region DP-A1 may be less than that of the third pixels PX3 disposed on the third region DP-A3. For example, the first region DP-A1 may have a resolution that is about ½, ⅜, ⅓, ¼, 2/9, ⅛, 1/9, or 1/16 of a resolution of the third region DP-A3. For example, the third region DP-A3 may have a resolution of equal to or greater than about 400 ppi, and the first region DP-A1 may have a resolution of about 200 ppi or about 100 ppi. The present disclosure, however, is not particularly limited thereto.

The first pixel circuit PC1 of the first pixel PX1 may not be disposed on the first region DP-A1. For example, the first pixel circuit PC1 may be disposed on the second region DP-A2 or the peripheral region DP-NA. In this case, the first region DP-A1 may have an optical transmittance that is increased compared to a case where the first pixel circuit PC1 is disposed on the first region DP-A1.

The first emission element LD1 and the first pixel circuit PC1 may be electrically connected through a connection line TWL. The connection line TWL may overlap the transmission region TA of the first region DP-A1.

On the first region DP-A1, the connection line TWL may be disposed between a first pixel electrode AE1 and a metal layer BML to be connected to the first pixel electrode AE1. The connection line TWL may extend toward the second region DP-A2 to be connected to the first pixel circuit PC1.

The connection line TWL may include a transparent conductive line. The transparent conductive line may include a transparent conductive material or an optically transmissive material. For example, the connection line TWL may be formed of a transparent conductive oxide (TCO) layer including indium tin oxide (ITO), indium zinc oxide (IZO), indium gallium zinc oxide (IGZO), zinc oxide (ZnO), or indium oxide ($In_2O_3$).

The second region DP-A2 may be adjacent to the first region DP-A1. The second region DP-A2 may surround at least a portion of the first region DP-A1. The second region DP-A2 may have a transmittance less than that of the first region DP-A1. In the present embodiment, the second region DP-A2 may be spaced apart from the peripheral region DP-NA. The present disclosure, however, is not limited thereto, and the second region DP-A2 may be in contact with the peripheral region DP-NA.

The second region DP-A2 may include the first pixel circuit PC1 of the first pixel PX1, the second emission element LD2, and the second pixel circuit PC2. Therefore, the second region DP-A2 may have an optical transmittance less than that of the first region DP-A1.

As the first pixel circuit PC1 of the first pixel PX1 is disposed on the second region DP-A2, in a unit area or the same area, the number of the second pixels PX2 disposed on the second region DP-A2 may be less than that of the third pixels PX3 disposed on the third region DP-A3. An image displayed on the second region DP-A2 may have a resolution less than that of an image displayed on the third region DP-A3.

The third region DP-A3 may be adjacent to the second region DP-A2. The third region DP-A3 may have a transmittance less than that of the first region DP-A1. The third region DP-A3 may include the third emission element LD3 and the third pixel circuit PC3.

The first emission element LD1 may have an oval shape in which a width in the second direction DR2 is greater than a width in the first direction DR1. However, to secure an interval between the first emission element LD1 and the third emission element LD3 disposed on the third region DP-A3, a first emission element LD1*n* disposed most adjacent to the third region DP-A3 may have an oval shape in which a width in the first direction DR1 is greater than a width in the second direction DR2. Each of the second and third emission elements LD2 and LD3 may have a circular shape.

The first emission element LD1, the second emission element LD2, and the third emission element LD3 may be provided in plural on the first region DP-A1, the second region DP-A2, and the third region DP-A3, respectively.

An interval between two most adjacent first emission elements LD1 may be greater than that between two most adjacent third emission elements LD3. An interval between two most adjacent second emission elements LD2 may be greater than that between two most adjacent third emission elements LD3.

Figure 7A:
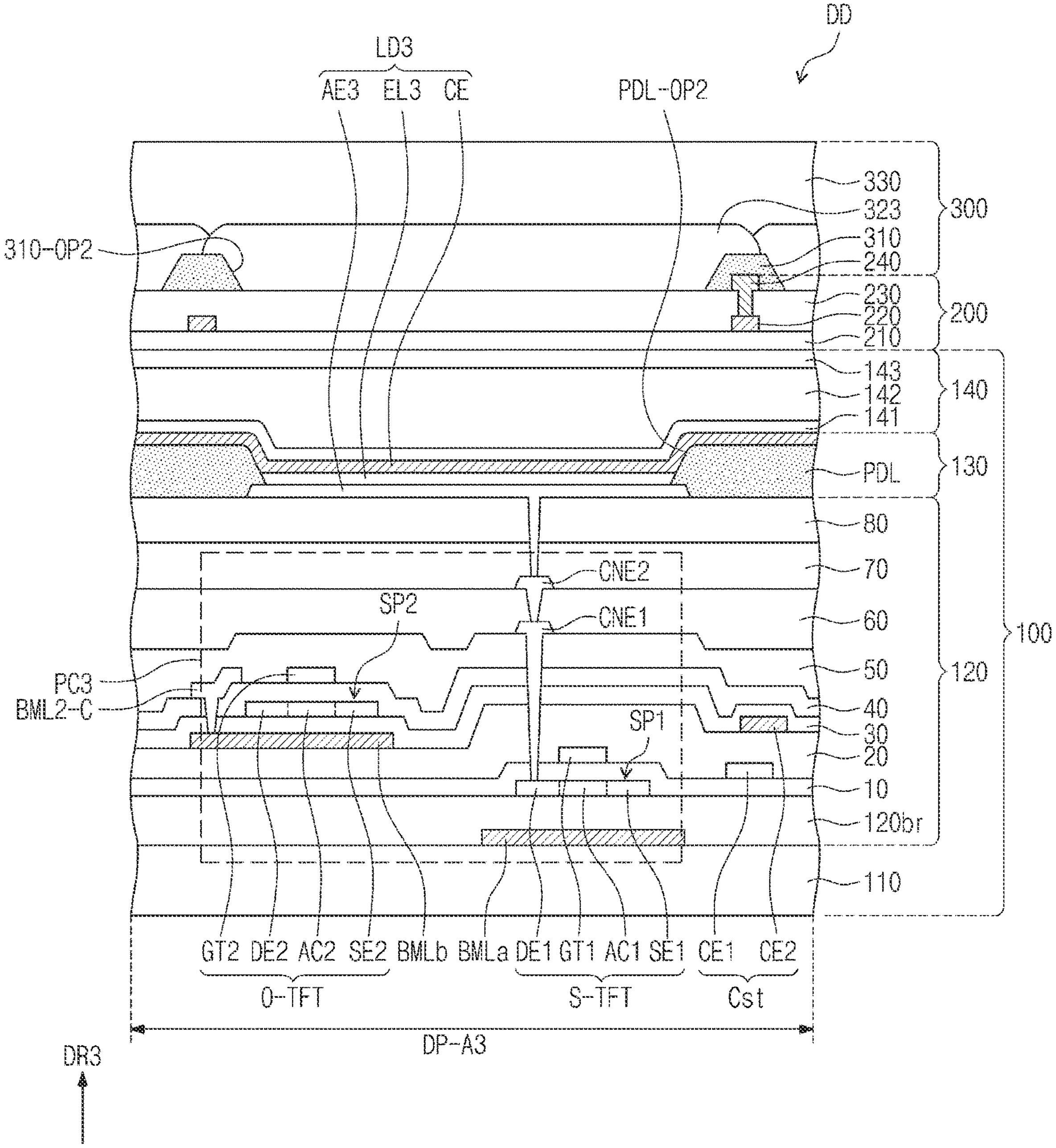
FIGS. 7A and 7B illustrate cross-sectional views showing a display device according to an embodiment of the present disclosure.
Figure 7B:
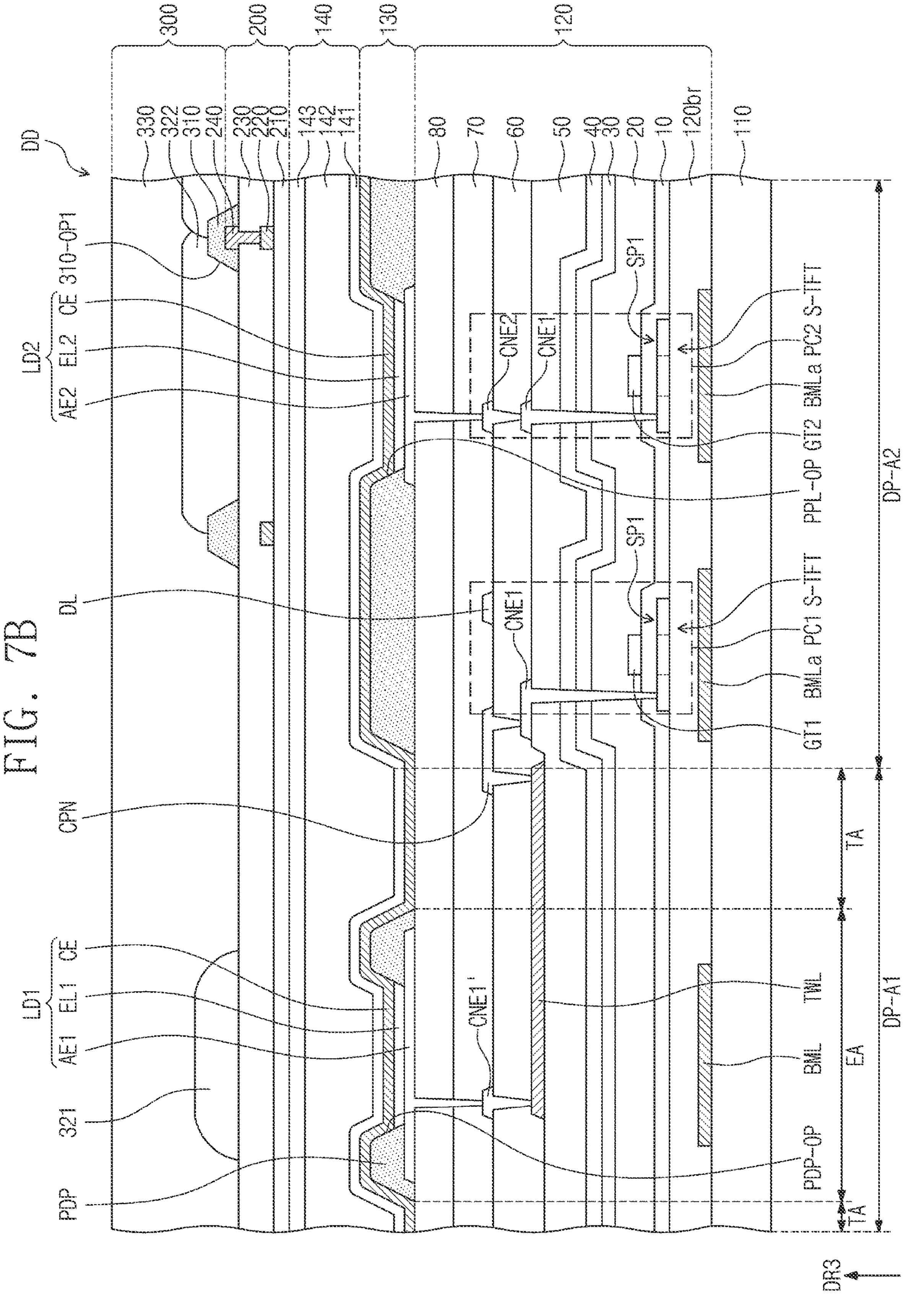

The first, second, and third emission elements LD1, LD2, and LD3 depicted in FIG. 5 may correspond to a planar shape of a first pixel electrode AE1 (FIG. 7B depicts a cross-section thereof) of the first emission element LD1, a planar shape of a second pixel electrode AE2 (FIG. 7B depicts a cross-section thereof) of the second emission element LD2, and a planar shape of a third pixel electrode AE3 (FIG. 7A depicts a cross-section thereof) of the third emission element LD3, respectively.

In plan view, the first pixel electrode AE1 may have an area greater than that of the third pixel electrode AE3. In addition, in plan view, the first pixel electrode AE1 may have an area greater than that of the third pixel electrode AE3.

The first emission elements LD1 disposed on the first region DP-A1 may include green emission elements G that are disposed in an odd-numbered row, red emission elements R that are disposed in an even-numbered row, and blue emission elements B that are disposed in the even-numbered row and are alternately disposed with the red emission elements R. The row may correspond to the first direction DR1. The green emission elements G disposed in the odd-numbered row may be disposed in staggered relation with the red and blue emission elements R and B disposed in the even-numbered row.

Figure 6:
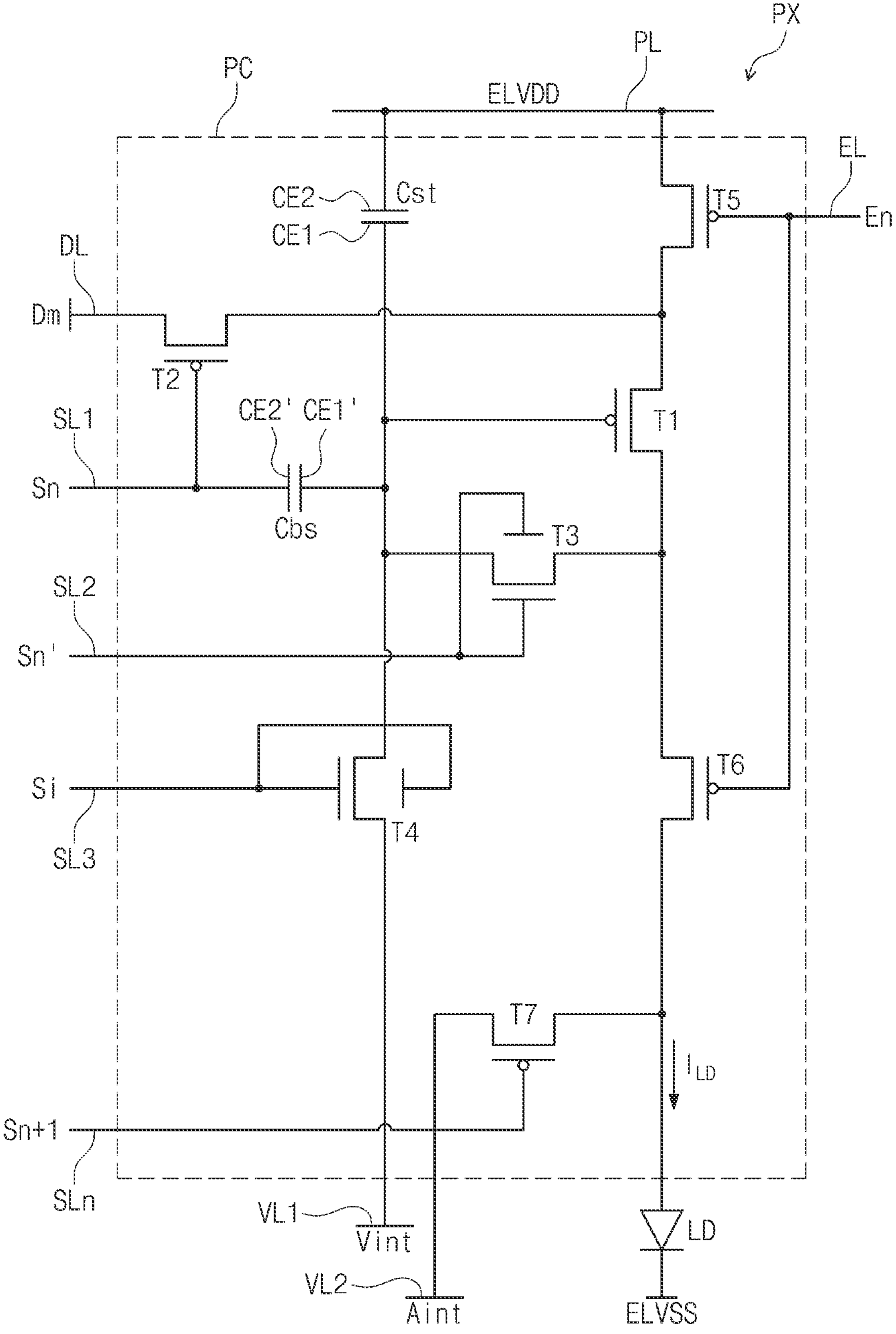
FIG. 6 illustrates an equivalent circuit diagram showing a pixel according to an embodiment of the present disclosure.

FIG. 6 illustrates an equivalent circuit diagram showing a pixel according to an embodiment of the present disclosure.

Referring to FIG. 6, there is illustrated an equivalent circuit for one of a plurality of pixels PX. The pixel PX depicted in FIG. 6 may be one of the first pixel (see PX1 of FIG. 4), the second pixel (see PX2 of FIG. 4), and the third pixel (see PX3 of FIG. 4).

The pixel PX may include an emission element LD and a pixel circuit PC. The emission element LD may be a component included in the emission element layer 130 of FIG. 3, and the pixel circuit PC may be a component included in the circuit layer 120 of FIG. 3. In addition, the emission element LD may correspond to each of the first, second, and third emission elements LD1, LD2, and LD3 depicted in FIG. 5, and the pixel circuit PC may correspond to each of the first, second, and third pixel circuits PC1, PC2, and PC3 depicted in FIG. 5.

The pixel circuit PC may include a storage capacitor Cst and a plurality of transistors T1, T2, T3, T4, T5, T5, and T7. The plurality of transistors T1, T2, T3, T4, T5, T6, and T7 and the storage capacitor Cst may be electrically connected to signal lines SL1, SL2, SL3, SLn, EL, and DL, a first initialization voltage line VL1, a second initialization voltage line VL2 (or anode initialization voltage line), and a driving voltage line PL. In an embodiment, the pixels PX may share at least one of the lines mentioned above, for example, the driving voltage line PL.

The plurality of transistors T1, T2, T3, T4, T5, T6, and T7 may include a driving transistor T1, a switching transistor T2, a compensation transistor T3, a first initialization transistor T4, an operation control transistor T5, an emission control transistor T6, and a second initialization transistor T7.

The emission element LD may include a lower electrode (or anode electrode or pixel electrode) and an upper electrode (or cathode electrode or common electrode), and the lower electrode of the emission element LD may be connected through the emission control transistor T6 to the driving transistor T1 and provided with a driving current ILD. The upper electrode of the emission element LD may be provided with a low-power voltage ELVSS. The emission element LD may generate light whose brightness corresponds to the driving current ILD.

Among the plurality of transistors T1, T2, T3, T4, T5, T6, and T7, at least one may be an NMOS (n-channel MOSFET), and at least another may be a PMOS (p-channel MOSFET). For example, among the plurality of transistors T1, T2, T3, T4, T5, T6, and T7, the compensation transistor T3 and the first initialization transistor T4 may be NMOS's (n-channel MOSFET's), and the others may be PMOS's (p-channel MOSFET's).

In another embodiment, among the plurality of transistors T1, T2, T3, T4, T5, T6, and T7, the compensation transistor T3, the first initialization transistor T4, and the second initialization transistor T7 may be NMOS's, and the others may be PMOS's. Alternatively, among the plurality of transistors T1, T2, T3, T4, T5, T6, and T7, only one may be an NMOS, and the others may be PMOS's. Dissimilarly, among the plurality of transistors T1, T2, T3, T4, T5, T6, and T7, all may be NMOS's or PMOS's.

The signal lines SL1, SL2, SL3, SLn, EL, and DL may include a first scan line SL1 that transmits a first scan signal Sn, a second scan line SL2 that transmits a second scan signal Sn', a third scan line SL3 that transmits a third scan signal Si to the first initialization transistor T4, an emission control line EL that transmits an emission control signal En to the operation control transistor T5 and the emission control transistor T6, a next scan line SLn that transmits a next scan signal Sn+1 to the second initialization transistor T7, and a data line DL that intersects the first scan line SL1 and transmits a data signal Dm.

The first scan signal Sn may be a current scan signal, and the next scan signal Sn+1 may be a scan signal following the first scan signal Sn.

The driving voltage line PL may transmit a driving voltage ELVDD to the driving transistor T1, and the first initialization voltage line VL1 may transmit an initialization voltage Vint that initializes the driving transistor T1 and a pixel electrode.

A driving gate electrode of the driving transistor T1 may be connected to the storage capacitor Cst, a driving source section of the driving transistor T1 may be connected through the operation control transistor T5 to the driving voltage line PL, and a driving drain section of the driving transistor T1 may be electrically connected through the emission control transistor T6 to a first electrode of the emission element LD.

In accordance with a switching operation of the switching transistor T2, the driving transistor T1 may receive the data signal Dm to supply the emission element LD with the driving current ILD.

A switching gate electrode of the switching transistor T2 may be connected to the first scan line SL1 that transmits the first scan signal Sn, a switching source section of the switching transistor T2 may be connected to the data line DL, and a switching drain section of the switching transistor T2 may be connected to the driving source section of the driving transistor T1 and also connected through the operation control transistor T5 to the driving voltage line PL.

In response to the first scan signal Sn transmitted through the first scan line SL1, the switching transistor T2 may be turned on to perform a switching operation by which the driving source section of the driving transistor T1 receives the data signal Dm transmitted to the data line DL.

A compensation gate electrode of the compensation transistor T3 may be connected to the second scan line SL2. A compensation drain section of the compensation transistor T3 may be connected to the driving drain section of the driving transistor T1 and also connected through the emission control transistor T6 to a pixel electrode of the emission element LD.

A compensation source section of the compensation transistor T3 may be connected to a first electrode CE1 of the storage capacitor Cst and the driving gate electrode of the driving transistor T1. In addition, the compensation source section may be connected a first initialization drain section of the first initialization transistor T4.

In response to the second scan signal Sn' transmitted through the second scan line SL2, the compensation transistor T3 may be turned on to electrically connect the driving gate electrode of the driving transistor T1 to the driving drain section of the driving transistor T1, thereby diode-connecting the driving transistor T1.

A first initialization gate electrode of the first initialization transistor T4 may be connected to the third scan line SL3. A first initialization source section of the first initialization transistor T4 may be connected to the first initialization voltage line VL1 and a second initialization source section of the second initialization transistor T7.

The first initialization drain section of the first initialization transistor T4 may be connected to the first electrode CE1 of the storage capacitor Cst, the compensation source section of the compensation transistor T3, and the driving gate electrode of the driving transistor T1.

In response to the third scan signal Si transmitted through the third scan line SL3, the first initialization transistor T4 may be turned on to provide the driving gate electrode of the driving transistor T1 with the initialization voltage Vint to perform an initialization operation that initializes a voltage of the driving gate electrode of the driving transistor T1.

An operation control gate electrode of the operation control transistor T5 may be connected to the emission control line EL, an operation control source section of the operation control transistor T5 may be connected to the driving voltage line PL, and an operation control drain section of the operation control transistor T5 may be connected to the driving source section of the driving transistor T1 and the switching drain section of the switching transistor T2.

An emission control gate electrode of the emission control transistor T6 may be connected to the emission control line EL, an emission control source section of the emission control transistor T6 may be connected to the driving drain section of the driving transistor T1 and the compensation drain section of the compensation transistor T3, and an emission control drain section of the emission control transistor T6 may be electrically connected to a second initialization drain section of the second initialization transistor T7 and a pixel electrode of the emission element LD.

In response to the emission control signal En transmitted through the emission control line EL, the operation control transistor T5 and the emission control transistor T6 may be simultaneously turned on to provide the emission element LD with the driving voltage ELVDD to allow the driving current ILD to flow through the emission element LD.

A second initialization gate electrode of the second initialization transistor T7 may be connected to the next scan line SLn, a second initialization drain section of the second initialization transistor T7 may be connected to the emission control drain section of the emission control transistor T6 and a pixel electrode of the emission element LD, and a second initialization source section of the second initialization transistor T7 may be connected to the second initialization voltage line VL2 and provided with an anode initialization voltage Aint.

In response to the next scan signal Sn+1 transmitted through the next scan line SLn, the second initialization transistor T7 may be turned on to initialize a pixel electrode of the emission element LD.

In another embodiment, the second initialization transistor T7 may be connected to the emission control line EL and may operate in response to the emission control signal En. A source section and a drain section may be interchangeably positioned based on a type (e.g., p-type or n-type) of a transistor.

The storage capacitor Cst may include a first electrode CE1 and a second electrode CE2. The first electrode CE1 of the storage capacitor Cst may be connected to the driving gate electrode of the driving transistor T1, and the second electrode CE2 of the storage capacitor Cst may be connected to the driving voltage line PL. The storage capacitor Cst may store charges that correspond to a difference between the driving voltage ELVDD and a voltage of the driving gate electrode of the driving transistor T1.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may be provided with the first scan signal Sn. The boosting capacitor Cbs may increase a voltage of the driving gate electrode of the driving transistor T1 at the time when the supply of the first scan signal Sn is interrupted, which may compensate a voltage drop of the driving gate electrode of the driving transistor T1.

The following will describe a detailed operation of the pixel PX according to an embodiment.

During an initialization period, when the third scan signal Si is supplied through the third scan line SL3, the first initialization transistor T4 may be turned on in response to the third scan signal Si, and the driving transistor T1 may be initialized by the initialization voltage Vint supplied from the first initialization voltage line VL1.

During a data programming period, when the first scan signal Sn and the second scan signal Sn' are supplied through the first scan line SL1 and the second scan line SL2, the switching transistor T2 and the compensation transistor T3 may be turned on in response to the first scan signal Sn and the second scan signal Sn'. In this case, the driving transistor T1 may be diode-connected by the turned-on compensation transistor T3 and may be biased in a forward direction.

The driving gate electrode of the driving transistor T1 may be provided with a compensation voltage Dm+Vth (where Vth is negative) obtained by subtracting a threshold voltage (Vth) of the driving transistor T1 from the data signal Dm supplied from the data line DL.

The storage capacitor Cst may be provided with the driving voltage ELVDD and the compensation voltage Dm+Vth at opposite end thereof, and may store a charge that corresponds to a difference in voltage between the opposite ends of the storage capacitor Cst.

During an emission period, the operation control transistor T5 and the emission control transistor T6 may be turned on by the emission control signal En supplied from the emission control line EL. The driving current ILD may occur due to a difference between the driving voltage ELVDD and a voltage of the driving gate electrode of the driving transistor T1, and the driving current ILD may be supplied through the emission control transistor T6 to the emission element LD.

In the present embodiment, among the plurality of transistors T1, T2, T3, T4, T5, T6, and T7, at least one may include a semiconductor layer including oxide, and the others may include a semiconductor layer including silicon.

For example, the driving transistor T1 that directly affects brightness of a display device may be configured to include a semiconductor layer formed of polysilicon having high reliability, and therefore the display device may achieve a high resolution.

As an oxide semiconductor has high carrier mobility and low leakage current, there may be no large voltage drop even when a driving time is long. For example, a low-frequency operation may be possible because there is no large color change in images caused by voltage drop even in the low-frequency operation.

Since an oxide semiconductor has an advantage of low leakage current as discussed above, the oxide semiconductor may be adopted to form at least one of the second initialization transistor T7, the first initialization transistor T4, and the compensation transistor T3 connected to the driving gate electrode of the driving transistor T1, such that it may be possible to prevent a leakage current that can flow to the driving gate electrode and also to reduce a power consumption.

FIGS. 7A and 7B illustrate cross-sectional views showing a display device according to an embodiment of the present disclosure. FIG. 7A shows a cross-sectional view including the third region DP-A3, and FIG. 7B shows a cross-sectional view including the first region DP-A1 and the second region DP-A2.

FIG. 7A depicts the third emission element LD3, a silicon transistor S-TFT of the third pixel circuit PC3, and an oxide transistor O-TFT of the third pixel circuit PC3. FIG. 7B depicts the first emission element LD1, the first pixel circuit PC1, the second emission element LD2, and the second pixel circuit PC2.

Referring to FIGS. 7A and 7B, a buffer layer **120*br* may be disposed on the base layer 110. The buffer layer 120*br* may prevent metal elements or impurities from diffusing from the base layer 110 toward a first semiconductor pattern SP1. In addition, the buffer layer 120*br*** may control a rate of introduction of heat during a crystallization process for the formation of the first semiconductor pattern SP1 to thereby uniformly form the first semiconductor pattern SP1.

A first metal layer BMLa may be disposed below the silicon transistor S-TFT, and a second metal layer BMLb may be disposed below the oxide transistor O-TFT. The silicon transistor S-TFT may be a transistor including a semiconductor layer that includes silicon discussed above. The oxide transistor O-TFT may be a transistor including a semiconductor layer that includes oxide discussed above.

The first and second metal layers BMLa and BMLb may be disposed to overlap the first, second, and third pixel circuits PC1, PC2, and PC3. The first and second metal layers BMLa and BMLb may be disposed on the base layer 110.

The first and second metal layers BMLa and BMLb may prevent an electric potential caused by polarization of the base layer 110 from affecting the first, second, and third pixel circuits PC1, PC2, and PC3. The first and second metal layers BMLa and BMLb may prevent external light from reaching the first, second, and third pixel circuits PC1, PC2, and PC3. None of the first and second metal layers BMLa and BMLb may overlap the first region DP-A1.

The first metal layer BMLa may be disposed between the base layer 110 and the buffer layer 120*br*. In an embodiment of the present disclosure, an inorganic barrier layer may further be disposed between the first metal layer BMLa and the buffer layer 120*br*. The first metal layer BMLa may be connected to an electrode or a wiring line, and may receive a constant voltage or a signal from the electrode or the wiring line. According to an embodiment of the present disclosure, the first metal layer BMLa may be a floating electrode that is isolated from other electrodes or wiring lines.

The second metal layer BMLb may be disposed between a second dielectric layer 20 and a third dielectric layer 30. The second metal layer BMLb may be located at the same level as that of the second electrode CE2 of the storage capacitor Cst. The second metal layer BMLb may be connected to a contact electrode BML2-C and may receive a constant voltage or a signal from the contact electrode BML2-C. The contact electrode BML2-C may be located at the same level as that of a gate GT2 of the oxide transistor O-TFT.

Each of the first and second metal layers BMLa and BMLb may include reflective metal. The first and second metal layers BMLa and BMLb may include the same material as each other or different materials from each other.

Each of the first and second metal layers BMLa and BMLb may include silver (Ag), an alloy containing silver (Ag), molybdenum (Mo), an alloy containing molybdenum (Mo), aluminum (Al), an alloy containing aluminum (Al), aluminum nitride (AlN), tungsten (W), tungsten nitride (WN), copper (Cu), or p+ doped amorphous silicon.

Although not shown separately, according to an embodiment of the present disclosure, the second metal layer BMLb may be omitted. The first metal layer BMLa may extend to an area below the oxide transistor O-TFT, and may thus block incidence of light on the area below the oxide transistor O-TFT.

A metal layer BML may be disposed below the first emission element LD1. The metal layer BML may be disposed between the base layer 110 and the buffer layer 120*br*. The metal layer BML may include the same material as that of the first and second metal layers BMLa and BMLb. The metal layer BML may be located at the same level as that of the first metal layer BMLa, but alternatively may be located at the same level as that of the second metal layer BMLb.

The metal layer BML may protect the first emission element LD1 when an opening pattern is formed in a common electrode CE which will be discussed below. This configuration will be further discussed in detail below.

The first semiconductor pattern SP1 may be disposed on the buffer layer 120*br*. The first semiconductor pattern SP1 may include a silicon semiconductor. The silicon semiconductor may include amorphous silicon and/or polycrystalline silicon. For example, the first semiconductor pattern SP1 may include low-temperature polysilicon.

FIGS. 7A and 7B depict a portion of the first semiconductor pattern SP1 that is disposed on the buffer layer 120*br*, and the first semiconductor pattern SP1 may further be disposed on another area. The first semiconductor pattern SP1 may be arranged at a specific rule over pixels PX.

The first semiconductor pattern SP1 may have electrical properties that are changed based on whether the first semiconductor pattern SP1 is doped or not. The first semiconductor pattern SP1 may include a first section whose conductivity is high and a second section whose conductivity is low. The first section may be doped with n-type or p-type impurities. A p-type transistor may include a doped section implanted with p-type impurities, and an n-type transistor may include a doped section implanted with n-type impurities. The second section may be an undoped section or may be a doped section implanted with impurities whose concentration is less than that of impurities doped in the first section.

The first section may have conductivity greater than that of the second section, and may substantially serve as an electrode or a signal line. The second section may substantially correspond to an active section (or channel) of a transistor. For example, a portion of a semiconductor pattern may be an active section of a transistor, another portion of a semiconductor pattern may be a source or drain of a transistor, and still another portion of a semiconductor pattern may be a connection electrode or a connection signal line.

The silicon transistor S-TFT may include a source section SE1 (or source), an active section AC1 (or channel), and a drain section DE1 (or drain), all of which are formed from the first semiconductor pattern SP1. The source section SE1 and the drain section DE1 may extend in opposite directions from the active section AC1 when viewed in vertical section.

A first dielectric layer 10 may be disposed on the buffer layer 120*br*. The first dielectric layer 10 may commonly overlap a plurality of pixels PX, and may cover the first semiconductor pattern SP1. The first dielectric layer 10 may be an inorganic layer.

The silicon transistor S-TFT may include a gate GT1 disposed on the first dielectric layer 10. The gate GT1 may be a portion of a metal pattern.

The first dielectric layer 10 may be provided thereon with a second dielectric layer 20 that covers the gate GT1. The second dielectric layer 20 may be an inorganic layer. A third dielectric layer 30 may be disposed on the second dielectric layer 20. The third dielectric layer 30 may be an inorganic layer.

The first electrode (see CE1 of FIG. 6) of the storage capacitor (see Cst of FIG. 6) may be disposed between the first dielectric layer 10 and the second dielectric layer 20. The second electrode (see CE2 of FIG. 6) of the storage capacitor (see Cst of FIG. 6) may be disposed between the second dielectric layer 20 and the third dielectric layer 30.

A second semiconductor pattern SP2 may be disposed on the third dielectric layer 30. The second semiconductor pattern SP2 may include an oxide semiconductor. An oxide semiconductor may include a plurality of sections that are divided based on whether transparent conductive oxide is reduced or not. A section (or a reducing section) where transparent conductive oxide is reduced may have conductivity greater than that of a section (or a non-reducing section) where transparent conductive oxide is not reduced.

The reducing section may substantially serve as a signal line or a source/drain of a transistor. The non-reducing section may substantially correspond to a semiconductor section (or active section or channel) of a transistor. For example, a portion of the second semiconductor pattern SP2 may be a semiconductor section of a transistor, another portion of the second semiconductor pattern SP2 may be a source/drain section of a transistor, and still another portion of the second semiconductor pattern SP2 may be a signal transfer section.

The oxide transistor O-TFT may include a source section SE2 (or source), an active section AC2 (or channel), and a drain section DE2 (or drain), all of which are formed from the second semiconductor pattern SP2. The source section SE2 and the drain section DE2 may extend in opposite directions from the active section AC2 when viewed in vertical section.

A fourth dielectric layer 40 may be disposed on the third dielectric layer 30. The fourth dielectric layer 40 may commonly overlap a plurality of pixels PX, and may cover the second semiconductor pattern SP2. The fourth dielectric layer 40 may be an inorganic layer.

The oxide transistor O-TFT may include a gate GT2 disposed on the fourth dielectric layer 40. The gate GT2 may be a portion of a metal pattern. The gate GT2 may overlap the active section AC2.

The fourth dielectric layer 40 may be provided thereon with a fifth dielectric layer 50 that covers the gate GT2. The fifth dielectric layer 50 may be one or more of an inorganic layer and an organic layer, and may have a single-layered or multi-layered structure.

A first connection electrode CNE1 may be disposed on the fifth dielectric layer 50. The first connection electrode CNE1 may be coupled to the drain section DE1 of the silicon transistor S-TFT through a contact hole that penetrates the first, second, third, fourth, and fifth dielectric layers 10, 20, 30, 40, and 50.

A sixth dielectric layer 60 may be disposed on the fifth dielectric layer 50. A second connection electrode CNE2 may be disposed on the sixth dielectric layer 60. The second connection electrode CNE2 may be coupled to the first connection electrode CNE1 through a contact hole that penetrates the sixth dielectric layer 60.

The sixth dielectric layer 60 may be provided with a seventh dielectric layer 70 that covers the second connection electrode CNE2. An eighth dielectric layer 80 may be disposed on the seventh dielectric layer 70. Each of the sixth, seventh, and eighth dielectric layers 60, 70, and 80 may be an organic layer.

Layers from the buffer layer **120*br* to the eighth dielectric layer 80 may be defined as the circuit layer 120. Layers on which the first, second, and third emission elements LD1, LD2, and LD3 may be defined as the emission element layer 130**.

The first emission element LD1 may include a first pixel electrode AE1, a first emission layer EL1, and a common electrode CE. The second emission element LD2 may include a second pixel electrode AE2, a second emission layer EL2, and a common electrode CE. The third emission element LD3 may include a third pixel electrode AE3, a third emission layer EL3, and a common electrode CE. The common electrode CE may have a single unitary shape and may be provided in common on the first, second, and third pixels PX1, PX2, and PX3. For example, the common electrode CE may be provided on the pixels PX.

The eighth dielectric layer 80 may be provided thereon with the first pixel electrode AE1, the second pixel electrode AE2, and the third pixel electrode AE3. Each of the first, second, and third pixel electrodes AE1, AE2, and AE3 may be a transmissive electrode, a transflective electrode, or a reflective electrode.

The reflective electrode may be formed of Ag, Mg, Al, Pt, Pd, Au, Ni, Nd, Ir, Cr, or a compound thereof. The transmissive or transflective electrode layer may include at least one selected from indium tin oxide (ITO), indium zinc oxide (IZO), indium gallium zinc oxide (IGZO), zinc oxide (ZnO), indium oxide ($In_2O_3$), and aluminum-doped zinc oxide (AZO). For example, each of the first, second, and third pixel electrodes AE1, AE2, and AE3 may include ITO/Ag/ITO.

A pixel definition layer PDL and a pixel definition pattern PDP may be disposed on the eighth dielectric layer 80. The pixel definition layer PDL and the pixel definition pattern PDP may be formed of the same material in the same material.

Each of the pixel definition layer PDL and the pixel definition pattern PDP may have optical absorption characteristics. For example, each of the pixel definition layer PDL and the pixel definition pattern PDP may have a black color.

The pixel definition pattern PDP may be disposed on the first region DP-A1. The pixel definition pattern PDP may cover an edge of the first pixel electrode AE1. When viewed in plan, the pixel definition pattern PDP may have a ring shape. The phrase "when viewed in plan" or "in plan view" may mean "when viewed in the third direction." The pixel definition pattern PDP may have an opening PDP-OP that exposes a portion of the first pixel electrode AE1.

The pixel definition layer PDL may be disposed on the second region DP-A2 and the third region DP-A3. The pixel definition layer PDL may cover an edge of each of the second pixel electrode AE2 and the third pixel electrode AE3. The pixel definition layer PDL may have a first opening PDL-OP1 that exposes a portion of the second pixel electrode AE2 and a second opening PDL-OP2 that exposes a portion of the third pixel electrode AE3.

On the first region DP-A1, a device region EA may be defined to indicate a section that overlaps a section where the first pixel electrode AE1 and the pixel definition pattern PDP are disposed, and a transmission region TA may be defined to indicate a section other than the device region EA.

The first pixel electrode AE1 may be electrically connected to the first pixel circuit PC1 disposed on the second region DP-A2. For example, the first pixel electrode AE1 may be electrically connected to the first pixel circuit PC1 through a connection line TWL and a connection bridge CPN. The connection line TWL may be connected to the first pixel electrode AE1 on the first region DP-A1 and may extend toward the second region DP-A2. The connection line TWL may overlap the transmission region TA. The connection line TWL may include an optically transmissive material.

The connection line TWL may be disposed between the fifth dielectric layer 50 and the sixth dielectric layer 60, but the present disclosure is not particularly limited thereto. The connection bridge CPN may be disposed between the sixth dielectric layer 60 and the seventh dielectric layer 70. The connection bridge CPN may be coupled to the connection line TWL and the first pixel circuit PC1.

The first emission layer EL1 may be disposed on the first pixel electrode AE1, the second emission layer EL2 may be disposed on the second pixel electrode AE2, and the third emission layer EL3 may be disposed on the third pixel electrode AE3. In the present embodiment, each of the first, second, and third emission layers EL1, EL2, and EL3 may emit light having one of blue, red, and green colors.

The common electrode CE may be disposed on the pixel definition layer PDL, the pixel definition pattern PDP, and the first, second, and third emission layers EL1, EL2, and EL3. The common electrode CE may be continuously and conformally disposed on the pixel definition layer PDL, the pixel definition pattern PDP, and the first, second, and third emission layers EL1, EL2, and EL3.

The common electrode CE may be a transmissive electrode. In an embodiment, the common electrode CE may be a transmissive or transflective electrode, and may be formed of a metallic thin layer having a low work-function and including one or more of Li, Ca, LiF/Ca, LiF/Al, Al, Ag, Mg, and a compound thereof. In addition, the metallic thin layer may be provided thereon with a transparent conductive oxide (TCO) layer including ITO, IZO, ZnO, or $In_2O_3$.

Although not shown, a hole control layer may be disposed between the first to third pixel electrodes AE1 to AE3 and the first to third emission layers EL1 to EL3. The hole control layer may include a hole transport layer and may further include a hole injection layer. An electron control layer may be disposed between the common electrode CE and the first to third emission layers EL1 to EL3. The electron control layer may include an electron transport layer and may further include an electron injection layer.

The encapsulation layer 140 may be disposed on the emission element layer 130. The encapsulation layer 140 may include an inorganic layer 141, an organic layer 142, and an inorganic layer 143 that are sequentially stacked, but layers included in the encapsulation layer 140 are not limited thereto. The inorganic layers 141 and 143 may protect the emission element layer 130 against moisture and oxygen, and the organic layer 142 may protect the emission element layer 130 against foreign substances such as dust particles.

The sensor layer 200 may be disposed on the display panel 100. The sensor layer 200 may be called a sensor, an input sensing layer, or an input sensing panel. The sensor layer 200 may include a base layer 210, a first conductive layer 220, a sensing dielectric layer 230, and a second conductive layer 240.

The base layer 210 may be directly disposed on the display panel 100. The base layer 210 may be an inorganic layer or an organic layer. The base layer 210 may have a single-layered structure or a multi-layered structure in which layers are stacked along the third direction DR3.

The first conductive layer 220 and the second conductive layer 240 may be disposed on the base layer 210. The sensing dielectric layer 230 may be disposed between the first conductive layer 220 and the second conductive layer 240. The sensing dielectric layer 230 may include an inorganic layer or an organic layer.

The antireflection layer 300 may be disposed on the sensor layer 200. The antireflection layer 300 may include a black matrix 310, a first color filter 321, a second color filter 322, a third color filter 323, and a planarization layer 330.

The black matrix 310 may have a black color. The black matrix 310 may cover the second conductive layer 240 of the sensor layer 200. The black matrix 310 may prevent external light from being reflected due to the second conductive layer 240. The black matrix 310 may overlap the second region DP-A2 and the third region DP-A3, and may not overlap the first region DP-A1. Because the black matrix 310 is not disposed on the first region DP-A1, there may be an increase in transmittance of the first region DP-A1.

The black matrix 310 may have a plurality of openings 310-OP1 and 310-OP2. The first opening 310-OP1 may overlap the second pixel electrode AE2, and the second opening 310-OP2 may overlap the third pixel electrode AE3.

The first color filter 321 may be disposed on the first region DP-A1, the second color filter 322 may be disposed on the second region DP-A2, and the third color filter 323 may be disposed on the third region DP-A3. The first color filter 321 may be disposed on the first emission element LD1, while overlapping the first pixel electrode AE1. The second color filter 322 may be disposed on the second emission element LD2, while overlapping the second pixel electrode AE2. The third color filter 323 may be disposed on the third emission element LD3, while overlapping the third pixel electrode AE3.

The first color filter 321 may not be in contact with the black matrix 310. The second color filter 322 may cover the first opening 310-OP1, and the third color filter 323 may cover the second opening 310-OP2. Each of the second and third color filters 322 and 323 may be in contact with the black matrix 310. Each of the first and second openings 310-OP1 and 310-OP2 of the black matrix 310 may have an area greater than that of each of the first and second openings PDL-OP1 and PDL-OP2 of the pixel definition layer PDL.

When a user is provided again with external light that travels toward the display panel 100 and is then reflected from the display panel 100, the external light may be visible to the user. To prevent this phenomenon, the first, second, and third color filters 321, 322, and 323 may display colors the same as those of the first, second, and third emission elements LD1, LD2, and LD3. The first, second, and third color filters 321, 322, and 323 may filter external light into colors the same as those of the first, second, and third emission elements LD1, LD2, and LD3. In this case, the external light may be invisible to users.

The planarization layer 330 may cover the black matrix 310, the first color filter 321, the second color filter 322, and the third color filter 323. The planarization layer 330 may include an organic material and may have a planarized top surface. In an embodiment, the planarization layer 330 may be omitted.

Referring to FIG. 7B, to increase a transmittance of the first region DP-A1, some dielectric layers may be removed from the first region DP-A1. For example, the first to fourth dielectric layers 10 to 40 may be removed from the first region DP-A1, and the fifth dielectric layer 50 may fill sections where the first to fourth dielectric layers 10 to 40 are removed.

Figure 8:
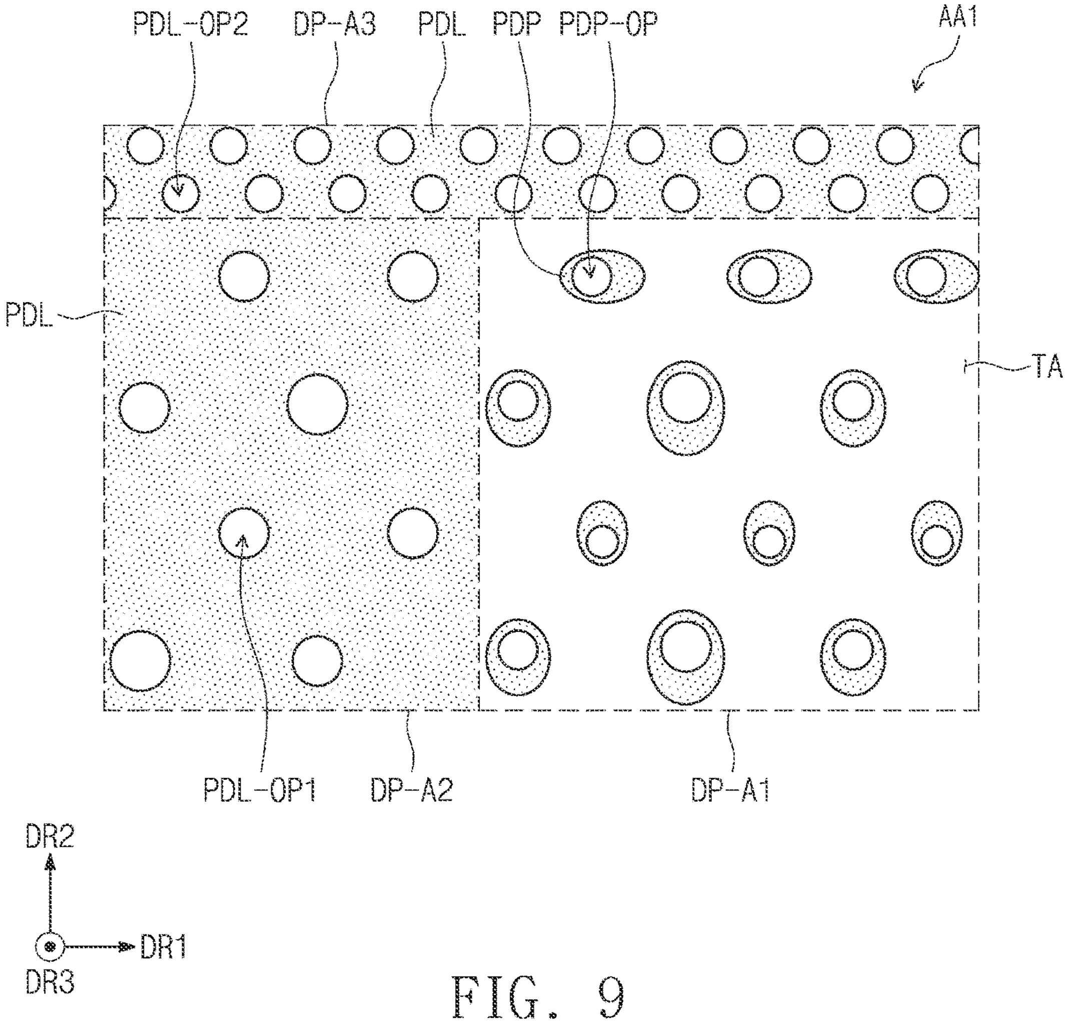
FIG. 8 illustrates a diagram showing a pixel definition layer and a pixel definition pattern on a first region AA1 depicted in FIG. 5.

FIG. 8 illustrates a diagram showing a pixel definition layer and a pixel definition pattern on a first region AA1 depicted in FIG. 5.

For example, in FIG. 8, the pixel definition layer PDL and the pixel definition pattern PDP are illustrated with a gray color, and other components are omitted.

Referring to FIG. 8, an opening PDP-OP may be defined in the pixel definition pattern PDP, and the pixel definition pattern PDP may have a ring shape. The opening PDP-OP may expose a portion of the first pixel electrode AE1 discussed above. The pixel definition pattern PDP may be provided in plural on the first region DP-A1, and the plurality of pixel definition patterns PDP may be disposed spaced apart from each other.

On the second region DP-A2, first openings PDL-OP1 may be defined in the pixel definition layer PDL. Each of the first openings PDL-OP1 may expose a portion of the second pixel electrode AE2 discussed above.

On the third region DP-A3, second openings PDL-OP2 may be defined in the pixel definition layer PDL. Each of the second openings PDL-OP2 may expose a portion of the third pixel electrode AE3 discussed above.

On the second and third regions DP-A2 and DP-A3, the pixel definition layer PDL may be formed as a single continuous layer. In contrast, on the first region DP-A1, the pixel definition patterns PDP may be spaced apart from each other in separate regions. The pixel definition pattern PDP may not be disposed on an entirety of the first region DP-A1.

A region between the pixel definition patterns PDP may correspond to the transmission region TA. Because the first region DP-A1 is provided thereon with the transmission region TA where the pixel definition patterns PDP are not disposed, the first region DP-A1 may have an optical transmittance greater than those of the second and third regions DP-A2 and DP-A3. Therefore, light that has passed through the first region DP-A1 may be provided to the electronic module CM discussed above.

Figure 9:
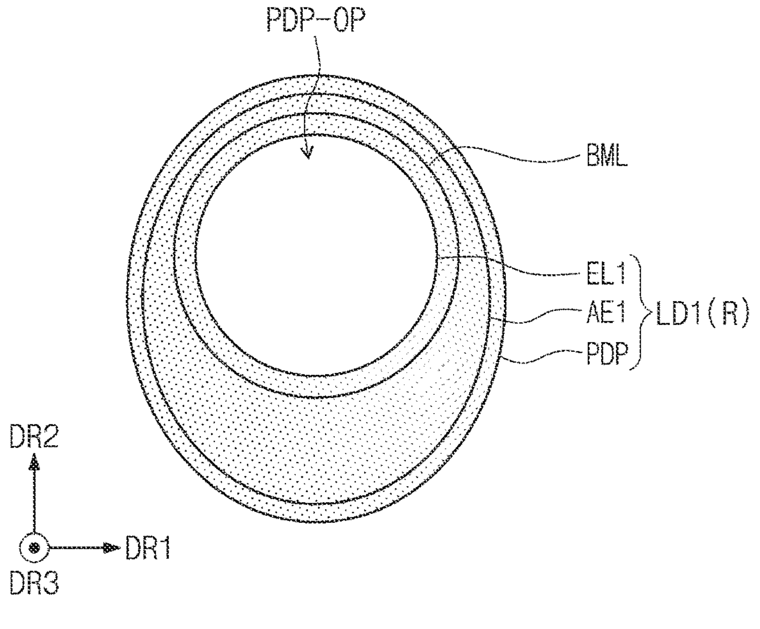
FIG. 9 illustrates an enlarged diagram showing a first emission element depicted in FIG. 5.

FIG. 9 illustrates an enlarged diagram showing a first emission element depicted in FIG. 5.

For example, in FIG. 9, the red emission element R of the first emission element LD1 is illustrated in plan view, and the pixel definition pattern PDP is depicted together with the red emission element R.

Referring to FIG. 9, in plan view, the first pixel electrode AE1 may have a width greater than that of the metal layer BML. In this description, the term "width" may be defined to indicate a value measured in the first direction DR1. The first pixel electrode AE1 may have an oval shape that extends longer in the second direction DR2 than in the first direction DR1.

In plan view, the metal layer BML may be disposed in and overlap the first pixel electrode AE1. Therefore, the first pixel electrode AE1 may overlap with the entirety of the metal layer BML and extend beyond an edge of the metal layer BML.

The first emission layer EL1 may have a width less than that of the metal layer BML. When viewed in plan, the first emission layer EL1 may overlap the metal layer BML.

In plan view, the pixel definition pattern PDP may overlap an edge of the first pixel electrode AE1 and an edge of the metal layer BML. The first emission layer EL1 may be disposed in the opening PDP-OP of the pixel definition pattern PDP defined by a ring shape.

The pixel definition pattern PDP may have an inner lateral surface that defines the opening PDP-OP and an outer lateral surface that is opposite to the inner lateral surface. In plan view, the first pixel electrode AE1 may be closer than the metal layer BML to the pixel definition pattern PDP.

Figure 10:
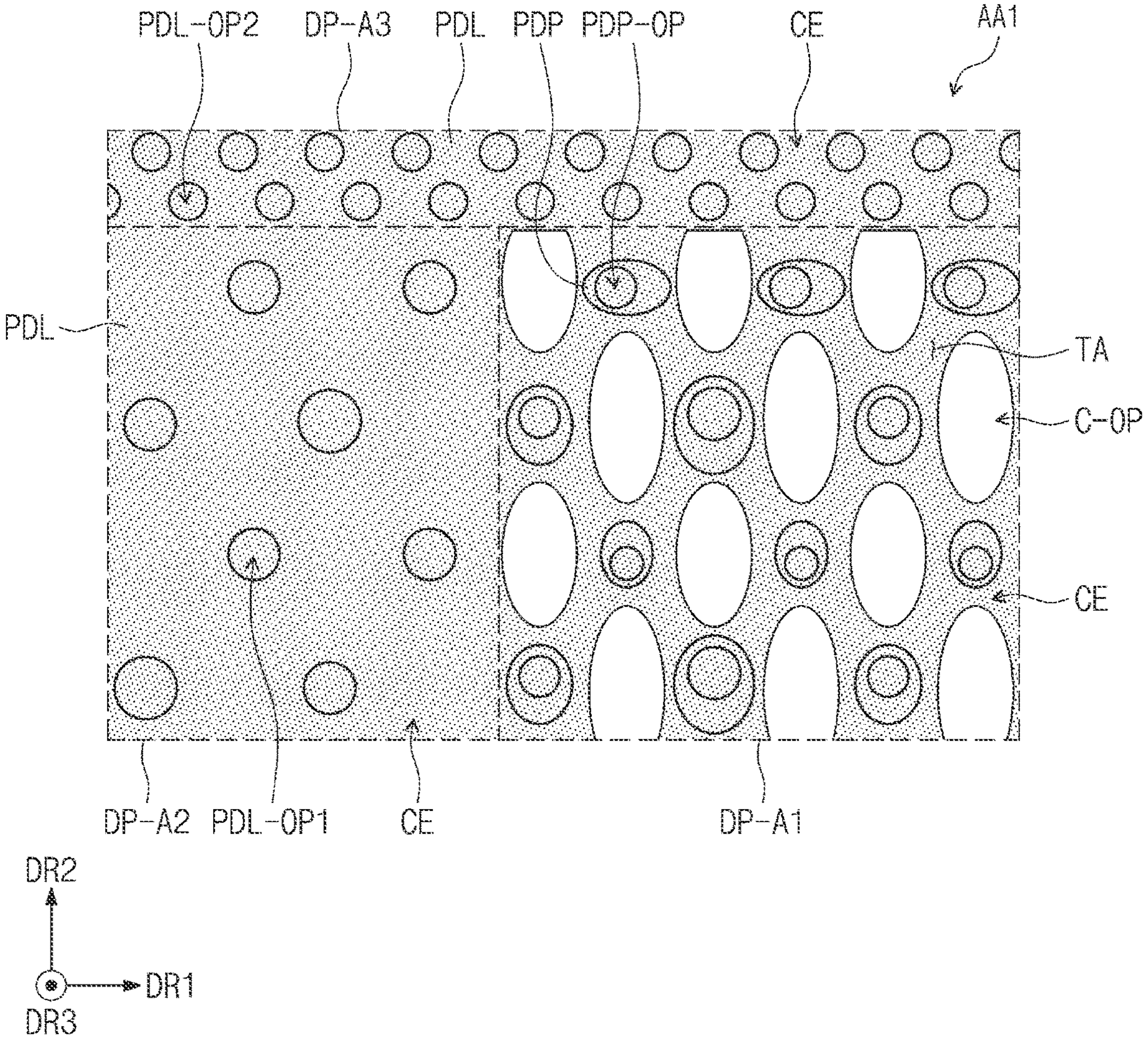
FIG. 10 illustrates a diagram in which a common electrode is added to FIG. 8.
Figure 11:
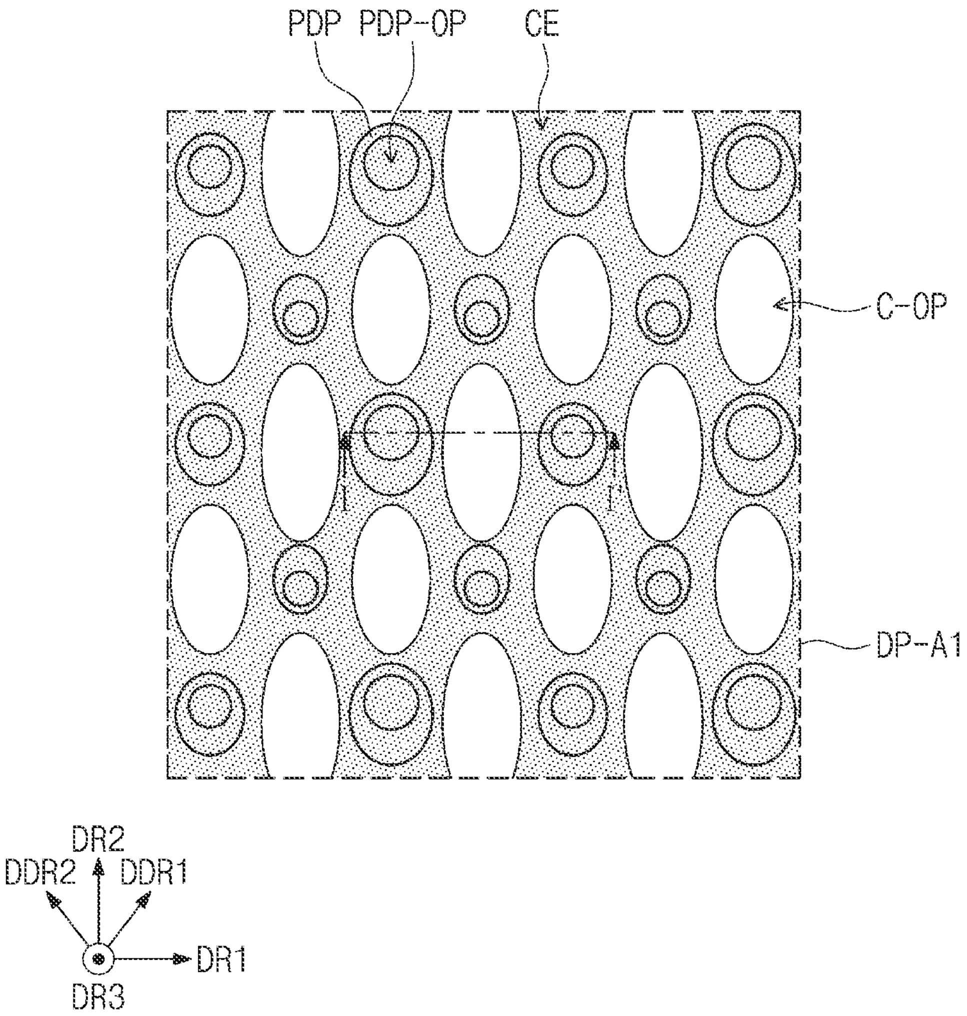
FIG. 11 illustrates a diagram showing a common electrode disposed on a central portion of a first region DP-A1 depicted in FIG. 4.

FIG. 10 illustrates a diagram in which a common electrode is added to FIG. 8. FIG. 11 illustrates a diagram showing a common electrode disposed on a central portion of a first region DP-A1 depicted in FIG. 4.

Referring to FIG. 10, the common electrode CE may be disposed on the first region DP-A1, the second region DP-A2, and the third region DP-A3. The common electrode CE may be formed as a continuous body on the first region DP-A1, the second region DP-A2, and the third region DP-A3. For example, the common electrode CE may not be separately formed on the first region DP-A1, the second region DP-A2, and the third region DP-A3, respectively.

In plan view, the common electrode CE may overlap the openings PDP-OP and the first and second openings PDL-OP1 and PDL-OP2. In plan view, the common electrode CE may overlap the pixel definition pattern PDP and the pixel definition layer PDL.

Referring to FIGS. 10 and 11, a plurality of openings C-OP may be defined in the common electrode CE disposed on the first region DP-A1. For example, on the first region DP-A1, an opening pattern may be defined in the common electrode CE.

The openings C-OP may be defined by removing portions of the common electrode CE that are disposed on the first region DP-A1. As the openings C-OP are defined by removing portions of the common electrode CE that are disposed on the first region DP-A1, there may be an increase in optical transmittance of the first region DP-A1. For example, a laser beam may be used to form the openings C-OP, and this process will be further discussed in detail below.

The openings C-OP may be defined between the pixel definition patterns PDP. As the first emission elements LD1 are disposed on the pixel definition patterns PDP, the openings C-OP may be disposed between the first emission elements LD1. The openings C-OP may each have an oval shape that extends longer in the second direction DR2 than in the first direction DR1, but the shape of the opening C-OP is not limited thereto.

The common electrode CE may be disposed on the pixel definition patterns PDP to extend toward the pixel definition patterns PDP, and around the pixel definition patterns PDP, the openings C-OP may be defined in the common electrode CE. The openings C-OP may be defined adjacent to the pixel definition patterns PDP.

The openings C-OP may be arranged in a first diagonal direction DDR1 and a second diagonal direction DDR2. On a plane defined by the first and second directions DR1 and DR2, the first diagonal direction DDR1 may be defined to indicate a direction that intersects the first and second directions DR1 and DR2. On a plane defined by the first and second directions DR1 and DR2, the second diagonal direction DDR2 may be defined to indicate a direction that intersects the first diagonal direction DDR1.

Figure 12:
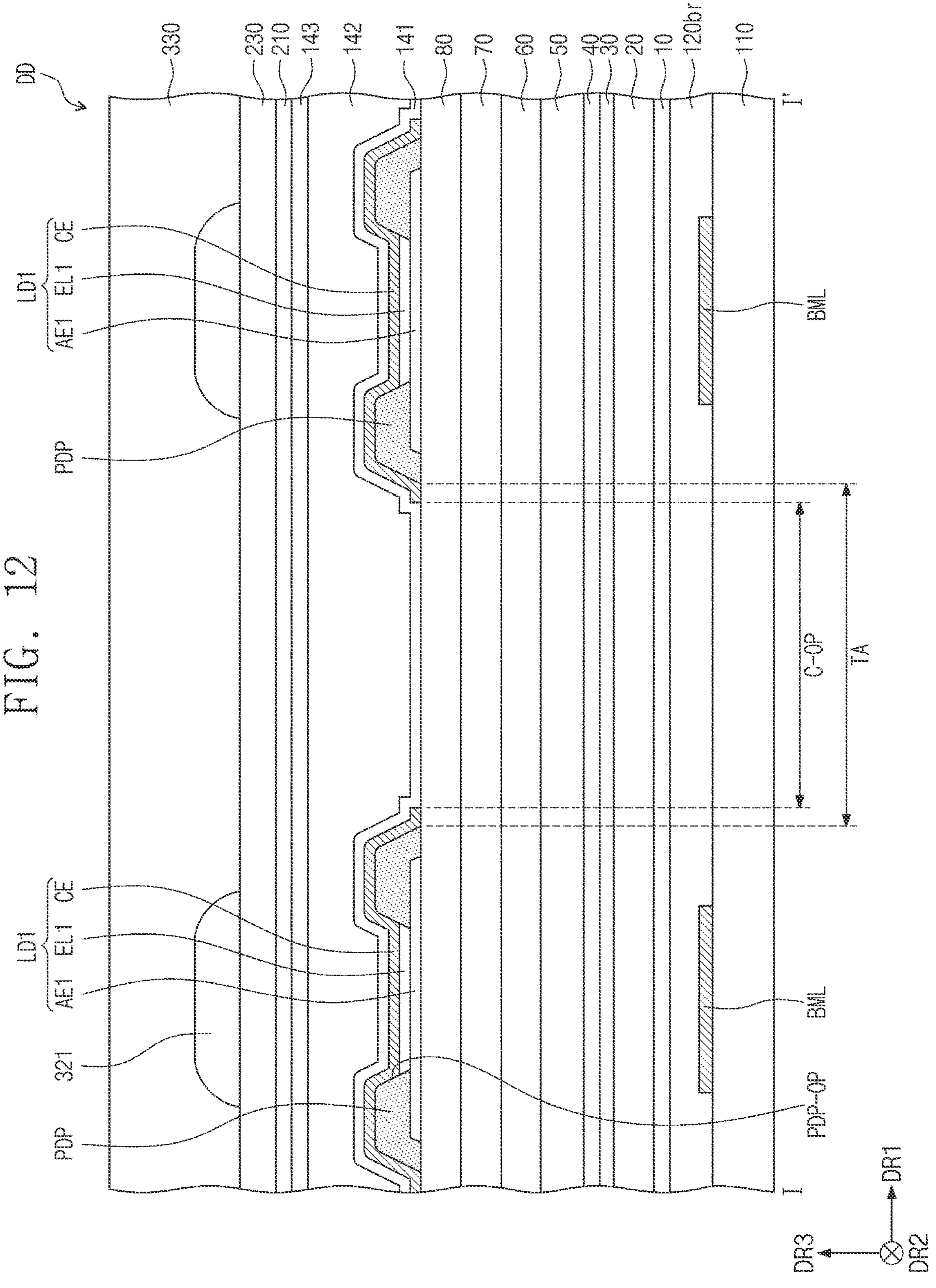
FIG. 12 illustrates a cross-sectional view taken along line I-I' of FIG. 11.

FIG. 12 illustrates a cross-sectional view taken along line I-I' of FIG. 11.

Referring to FIG. 12, the display device DD may have a cross-sectional configuration that corresponds to that of the first emission element LD1, and a description of the cross-sectional configuration will be omitted because the cross-sectional configuration is discussed in detail in FIG. 7B. For example, the connection line TWL depicted in FIG. 7B is omitted in FIG. 12.

A region between the first emission elements LD1 may be defined as a transmission region TA. For example, a region between the pixel definition patterns PDP may be defined as the transmission region TA. As the pixel definition patterns PDP are not disposed on the transmission region TA, there may be an increase in optical transmittance of the transmission region TA.

An opening C-OP may be defined on the transmission region TA. For example, the opening C-OP may be defined between the first emission elements LD1. In addition, the opening C-OP may be defined between the pixel definition patterns PDP.

After the common electrode CE is formed on an entirety of the first region DP-A1, the opening C-OP may be formed by removing a portion of the common electrode CE that overlaps a selected section for forming the opening C-OP. The opening C-OP may allow the transmission region TA to have an increased optical transmittance.

The opening C-OP may be defined adjacent to the pixel definition patterns PDP. The opening C-OP may be spaced apart from outer lateral surfaces of the pixel definition patterns PDP. The present disclosure, however, is not limited thereto, and the outer edge of the opening C-OP may be defined to align with the outer lateral surfaces of the pixel definition patterns PDP. The first pixel electrodes AE1 may be disposed closer than the metal layers BML to the opening C-OP.

Figure 13:
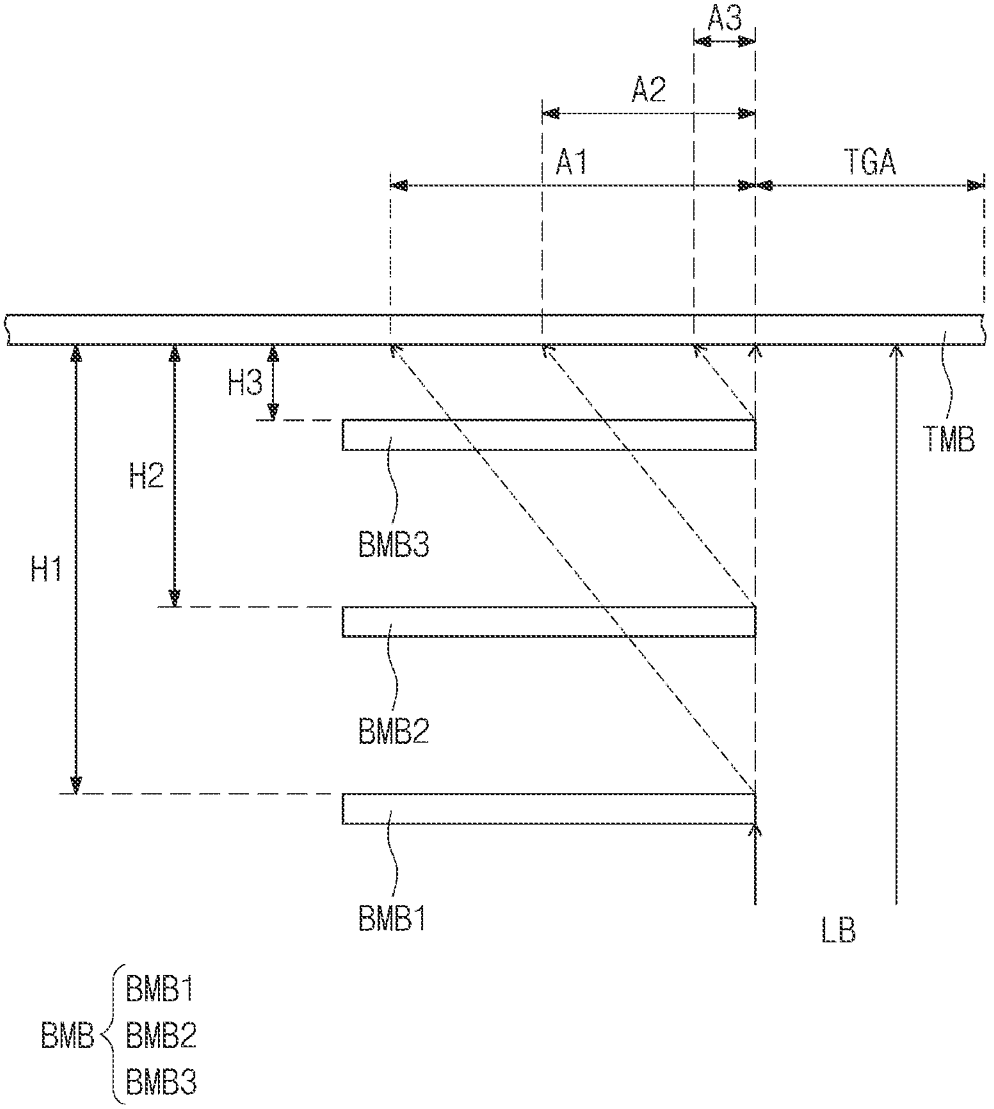
FIG. 13 illustrates a diagram showing a propagation path of a laser beam.

FIG. 13 illustrates a diagram showing a propagation path of a laser beam.

Referring to FIG. 13, a laser beam LB may be irradiated toward a target member TMB from below the target member TMB including a target region TGA. The laser beam LB may be aimed at the target region TGA, for removal of the target region TGA.

To allow the laser beam LB to travel only to the target region TGA, a shield member BMB may be used to block the laser beam LB. The shield member BMB may include a first shield member BMB1, a second shield member BMB2, and a third shield member BMB3. One of the first, second, and third shield members BMB1, BMB2, and BMB3 may be used when the laser beam LB is irradiated toward the target member TMB.

The first shield member BMB1 may be disposed lower than the second shield member BMB2, and the second shield member BMB2 may be disposed lower than the third shield member BMB3. The target member TMB may be disposed higher by a first height H1 than the first shield member BMB1. The target member TMB may be disposed higher by a second height H2 than the second shield member BMB2. The target member TMB may be disposed higher by a third height H3 than the third shield member BMB3. The first height H1 may be greater than the second height H2, and the second height H2 may be greater than the third height H3.

When the first shield member BMB1 is used, a diffraction phenomenon of light may be created at an edge of the first shield member BMB1. Depending on the diffraction phenomenon, the laser beam LB may not be irradiated only to the target region TGA, and depending on a diffraction angle of the laser beam LB, the laser beam LB may be irradiated to a first region A1 of the target member TMB adjacent to the target region TGA.

When the second shield member BMB2 is used, a diffraction phenomenon of light may be created at an edge of the second shield member BMB2. The diffraction phenomenon may cause the laser beam LB to be irradiated not only to the target region TGA but also to a second region A2 of the target member TMB adjacent to the target region TGA, based on a diffraction angle of the laser beam LB.

When the third shield member BMB3 is used, a diffraction phenomenon of light may be created at an edge of the third shield member BMB3. The diffraction phenomenon may cause the laser beam LB to be irradiated only to the target region TGA but also to a third region A3 of the target member TMB adjacent to the target region TGA, based on a diffraction angle of the laser beam LB.

The first region A1 may be greater than the second region A2, and the second region A2 may be greater than the third region A3. For example, the greater distance between the shield member BMB and the target member TMB, the larger irradiation region on the target member TMB to which the laser beam LB is irradiated based on a diffraction angle of the laser beam LB.

Figure 14:
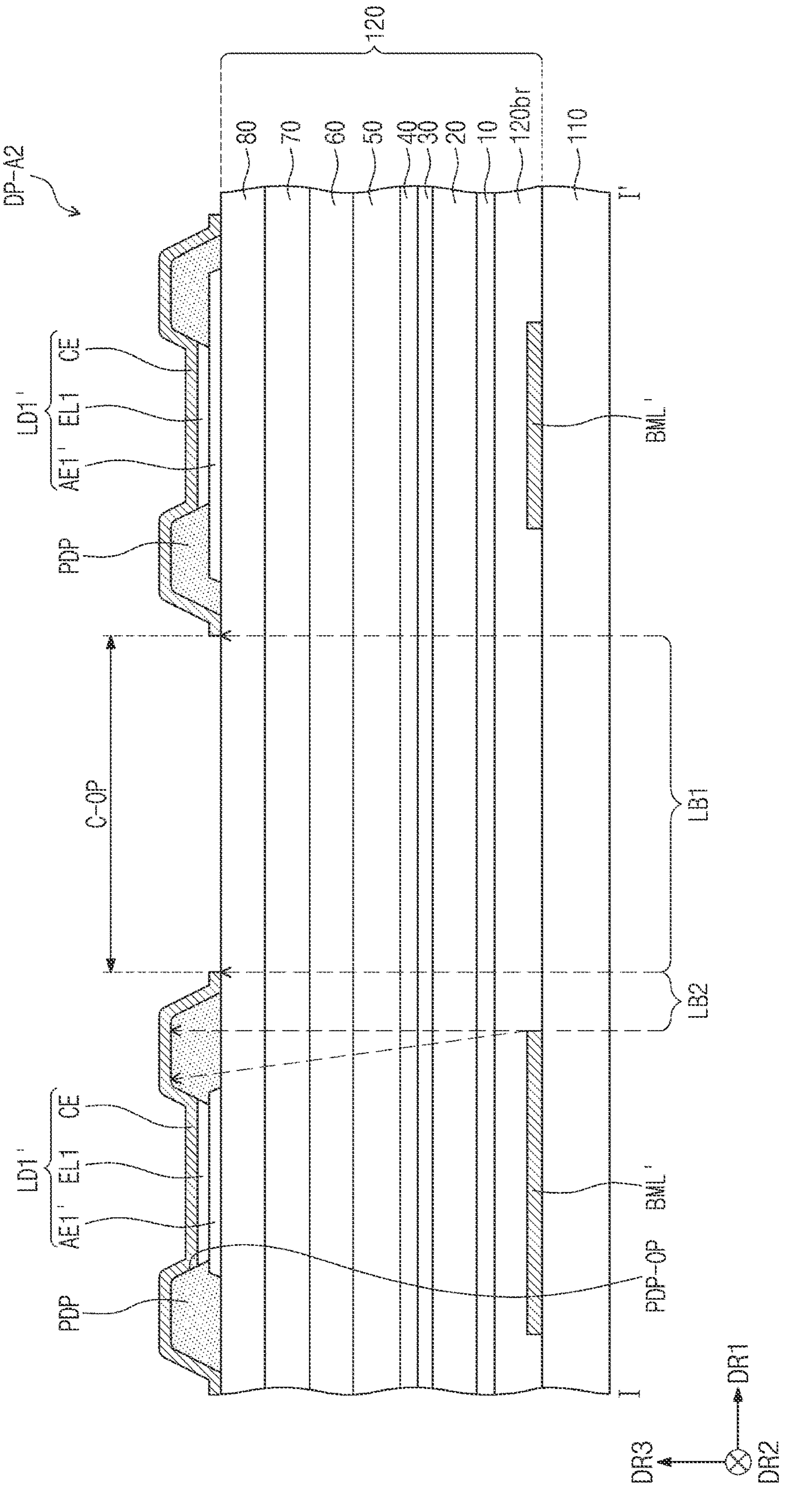
FIG. 14 illustrates a diagram showing a process for forming an opening of a common electrode in a cross-sectional configuration of a metal layer and a first emission element according to a comparative example.
Figure 15:
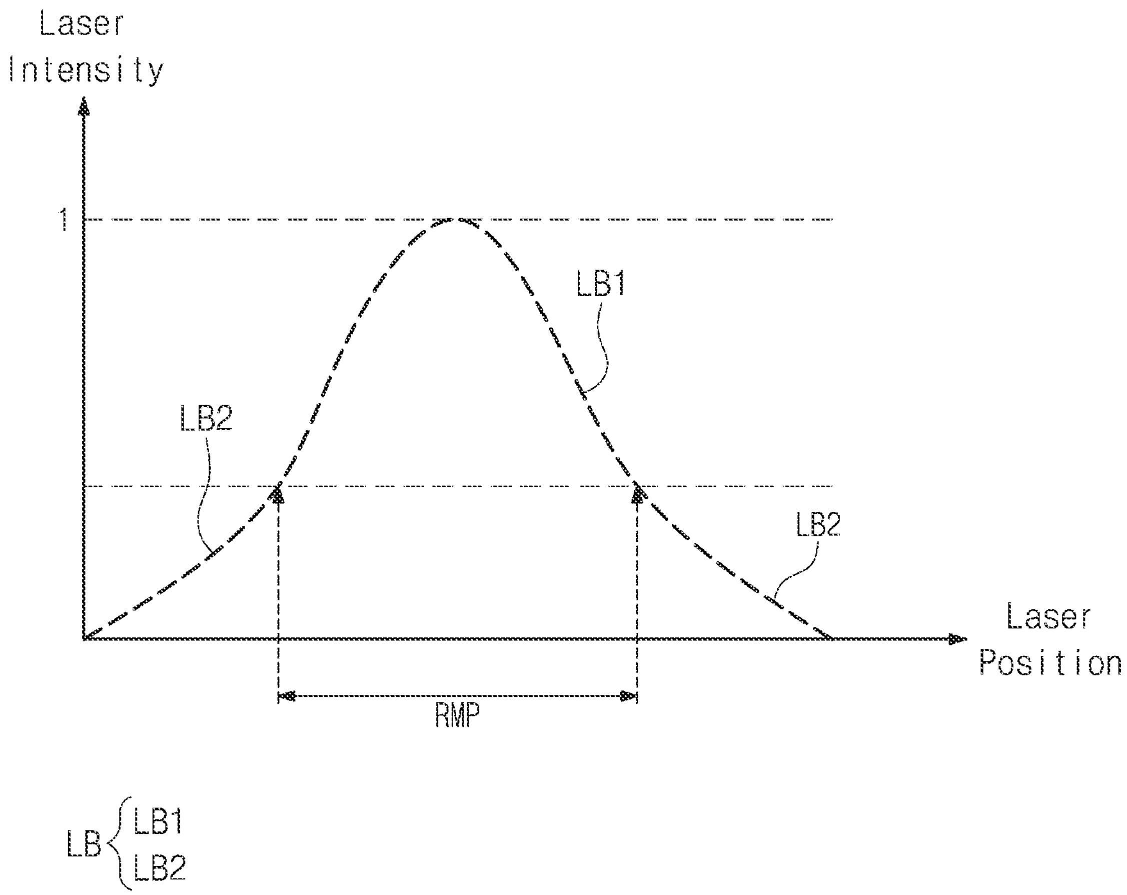
FIG. 15 illustrates a diagram showing Gaussian distribution of a laser beam depicted in FIG. 14.

FIG. 14 illustrates a diagram showing a process for forming an opening of a common electrode in a cross-sectional configuration of a metal layer and a first emission element according to a comparative example. FIG. 15 illustrates a diagram showing Gaussian distribution of a laser beam depicted in FIG. 14.

The following description will focus on a cross-sectional configuration depicted in FIG. 14 different from that depicted in FIG. 12.

Referring to FIG. 14, differently from the component depicted in FIG. 12, metal layers BML' may have their widths greater than those of first pixel electrodes AE1' of first emission elements LD1'. For example, when viewed in plan, the metal layers BML' may be closer than the first pixel electrodes AE1' to the outer lateral surfaces of the pixel definition patterns PDP.

The laser beam LB may be irradiated from below the base layer 110 toward a portion of the common electrode CE to form the opening C-OP. A removal part RMP may be defined to indicate the portion of the common electrode CE for forming the opening C-OP. The first emission elements LD1' may be damaged when the laser beam LB is irradiated toward the common electrode CE from above the first emission elements LD1', and thus the laser beam LB may be irradiated from below the base layer 110 toward the common electrode CE.

When the laser beam LB is irradiated toward the common electrode CE, the metal layers BML' may prevent the laser beam LB from being irradiated toward the first emission elements LD1'. For example, when an opening pattern is formed in the common electrode CE, the metal layers BML' may serve to protect the first emission elements LD1'.

Referring to FIGS. 14 and 15, in accordance with Gaussian distribution, the laser beam LB may include a first laser beam LB1 and a second laser beam LB2. The first laser beam LB1 may have intensity greater than that of the second laser beam LB2. In accordance with Gaussian distribution, the second laser beam LB2 may be present in addition to the first laser beam LB1 and may have intensity less than that of the first laser beam LB1.

Figure 17:
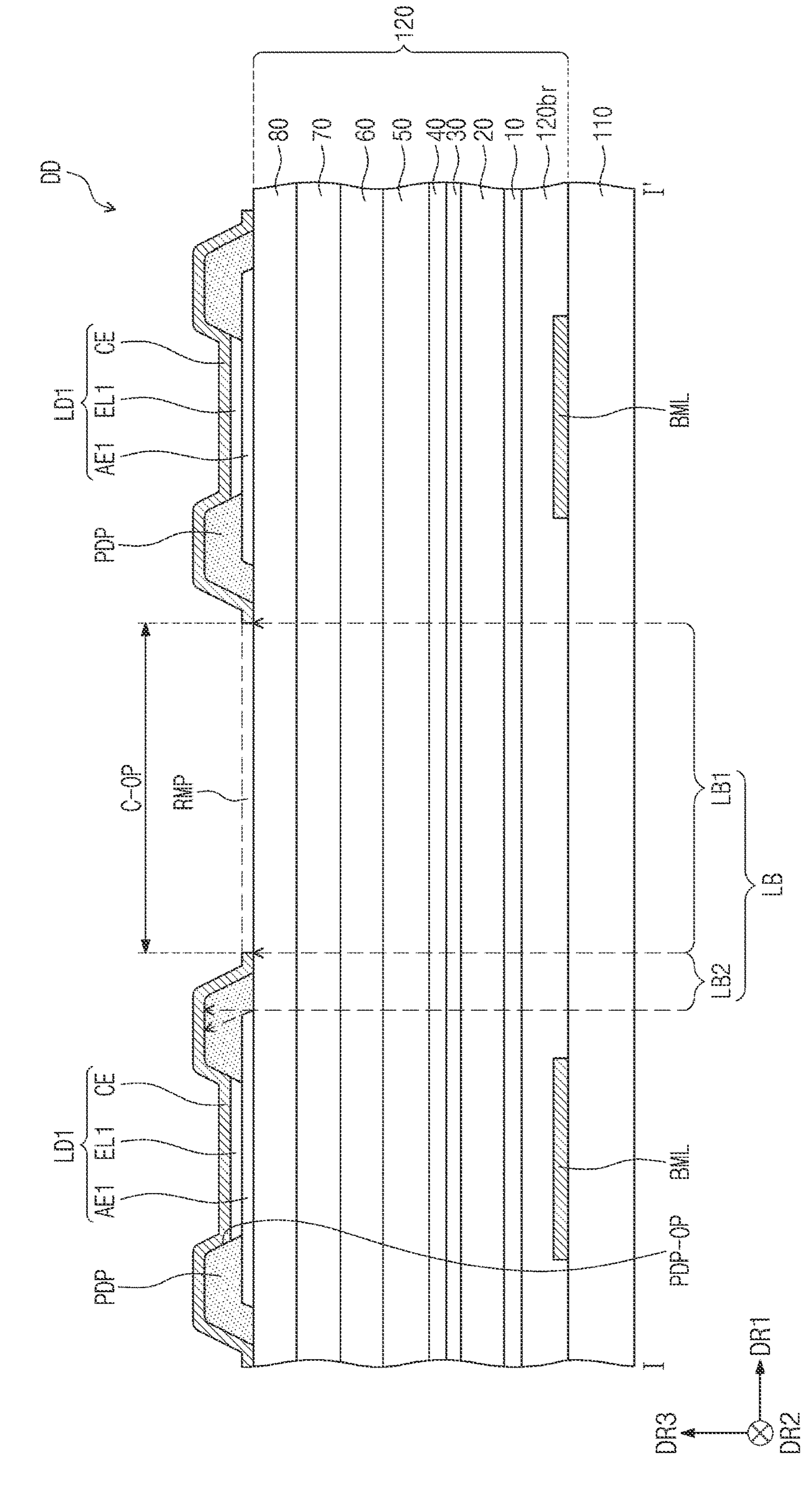
FIG. 17 illustrates a diagram showing a process for forming an opening of a common electrode in a cross-sectional configuration depicted in FIG. 12.

The first laser beam LB1 may be set to have intensity enough to sufficiently remove the removal part RMP of the common electrode CE (see, e.g. FIG. 17). The first laser beam LB1 may be irradiated toward the removal part RMP. The first laser beam LB1 may remove the removal part RMP.

As there is a limitation imposed on accurately controlling a focus of the laser beam LB, even when the laser beam LB is focused on the removal part RMP, in accordance with Gaussian distribution, the laser beam LB may also be irradiated to a circumference of the removal part RMP. The laser beam LB irradiated to the circumference of the removal part RMP may be the second laser beam LB2.

The second laser beam LB2 may be diffracted from edges of the metal layers BML'. The common electrode CE disposed on the pixel definition patterns PDP may be irradiated with the second laser beam LB2 that is diffracted from the edges of the metal layers BML'.

Figure 16:
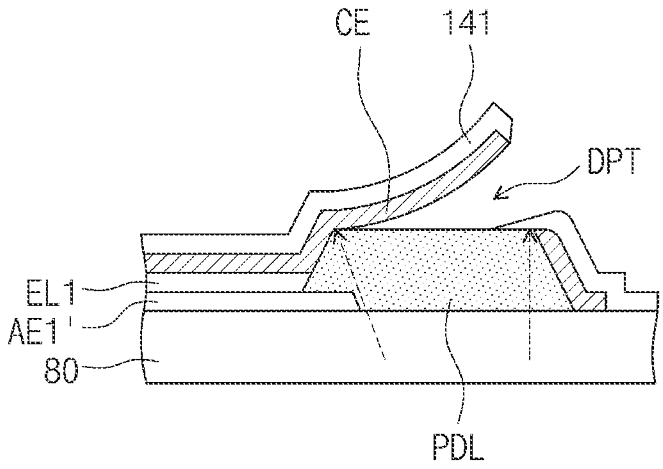
FIG. 16 illustrates a diagram partially showing a common electrode that can be damaged by a second laser beam depicted in FIG. 14.

FIG. 16 illustrates a diagram partially showing a common electrode that can be damaged by a second laser beam depicted in FIG. 14.

Referring to FIGS. 14 and 16, as the metal layers BML' are disposed on the base layer 110, a large distance may be provided between the metal layers BML' and the common electrode CE. Therefore, as discussed in FIG. 13, based on a diffraction angle of the laser beam LB, the common electrode CE on the pixel definition pattern PDP may have an increased irradiation region to which the second laser beam LB2 is irradiated.

The first laser beam LB1 may have intensity enough to completely remove the removal part RMP of the common electrode CE. However, when the common electrode CE is irradiated with the second laser beam LB2 having low intensity, there may occur a burr that the common electrode CE is partially lifted upwardly from the pixel definition pattern PDP. For example, the second laser beam LB2 may lift a flat portion of the common electrode CE disposed on the flat pixel definition pattern PDP.

An increase in irradiation region on the common electrode CE to which the second laser beam LB2 is irradiated may cause an increase in possibility of the occurrence of burr. In addition, an increase in irradiation region on the common electrode CE to which the second laser beam LB2 is irradiated may cause an increase in area of damage to the common electrode CE. When the common electrode CE is damaged, a damaged portion of the common electrode CE may rise and curve upwardly. An increase in damaged area of the common electrode CE may urge the damage portion of the common electrode CE to curve more upwardly.

In this case, the inorganic layer 141 may not be properly deposited, and a defective region DPT may occur from the inorganic layer 141 is missing. Therefore, external contamination particles may be introduced along the defective region DPT to induce damage to elements (e.g., emission elements).

Figure 18:
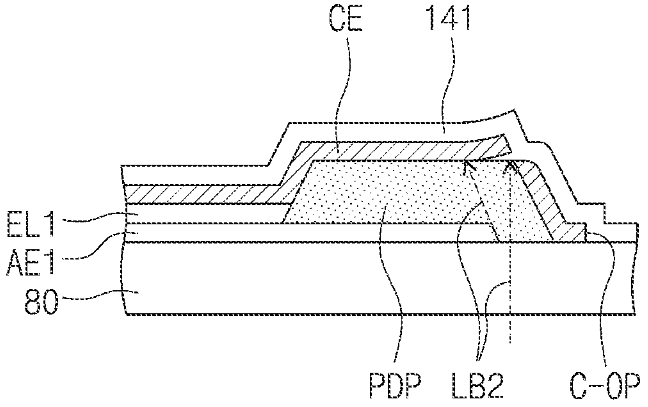
FIG. 18 illustrates a diagram partially showing a common electrode that can be damaged by a second laser beam depicted in FIG. 17.

FIG. 17 illustrates a diagram showing a process for forming an opening of a common electrode in a cross-sectional configuration depicted in FIG. 12. FIG. 18 illustrates a diagram partially showing a common electrode that can be damaged by a second laser beam depicted in FIG. 17.

Referring to FIG. 17, differently from the configuration depicted in FIG. 14, the metal layers BML may have their widths greater than those of the first pixel electrodes AE1. The laser beam LB may be irradiated from below the base layer 110 toward a portion of the common electrode CE to form the opening C-OP.

The first laser beam LB1 may be irradiated toward the removal part RMP, thereby removing the removal part RMP. The second laser beam LB2 that propagates in an upward direction may not be diffracted from edges of the metal layers BML, but may be diffracted from edges of the first pixel electrodes AE1 having their widths greater than those of the metal layers BML.

Referring to FIGS. 17 and 18, the first pixel electrodes AE1 may be disposed closer than the metal layers BML to the common electrode CE. For example, a distance between the first pixel electrodes AE1 and the common electrode CE may be less than that between the metal layers BML and the common electrode CE.

As discussed in FIG. 13, as a small distance is provided between the first pixel electrodes AE1 and the common electrode CE, based on a diffraction angle of the laser beam LB, the common electrode CE on the pixel definition pattern PDP may have a reduced irradiation region to which the second laser beam LB2 is irradiated. When there is a reduction in irradiation region on the common electrode CE to which the second laser beam LB2 is irradiated, there may be a reduced possibility of damage to the common electrode CE. For example, the smaller irradiation region on the common electrode CE to which the second laser beam LB2 is irradiated, the lower possibility of the occurrence of burr.

Even when the common electrode CE is damaged, an irradiation region on the common electrode CE to which the second laser beam LB2 is irradiated may be reduced to decrease a damaged area of the common electrode CE. As there is a reduction in damaged area of the common electrode CE, a damage portion of the common electrode CE may curve. In this case, the inorganic layer 141 may be deposited properly to cover the common electrode CE, avoiding the formation of the defective region DPT. Accordingly, elements may be prevented from being damaged.

FIGS. 19 to 24 illustrate diagrams showing components of a display device according to an embodiment of the present disclosure.

Figure 19:
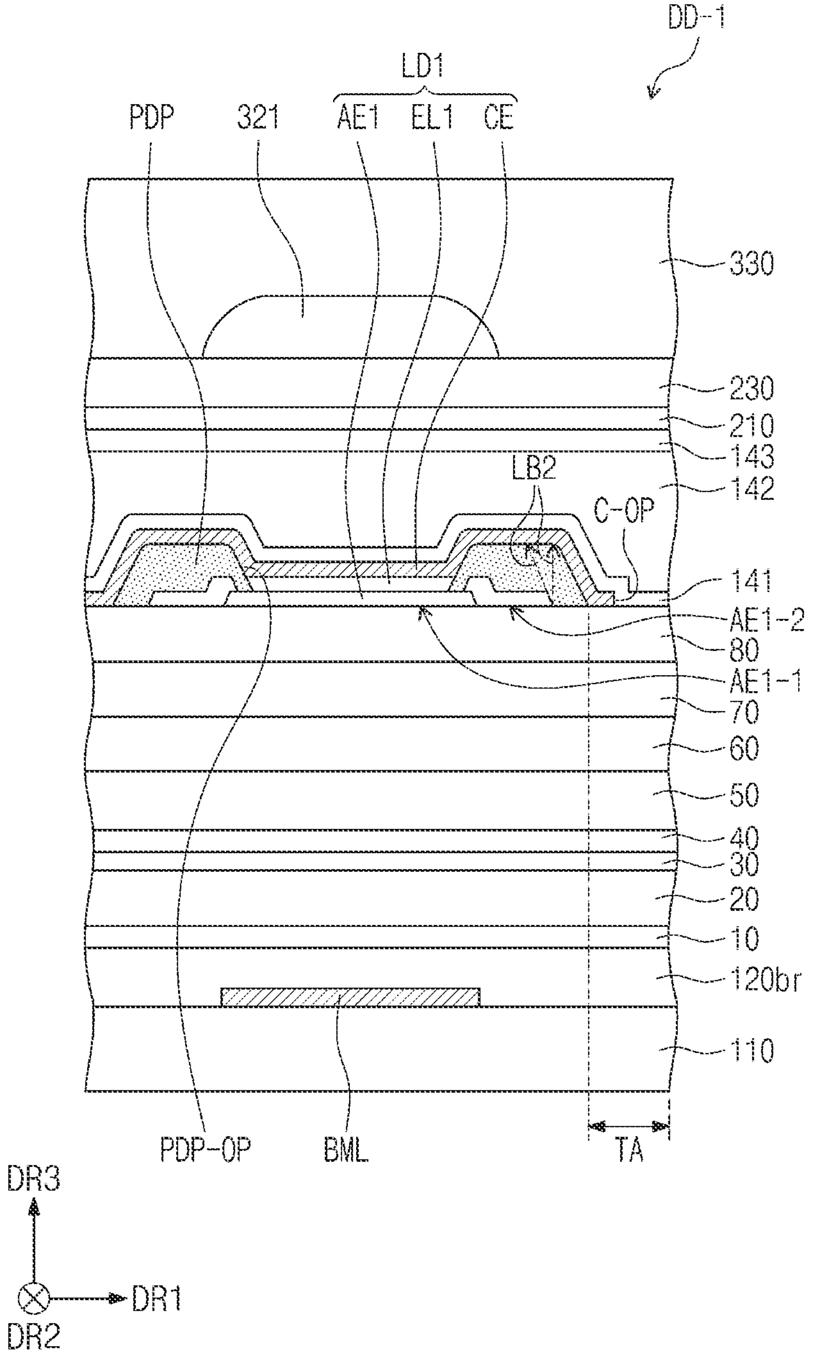
FIGS. 19 to 24 illustrate diagrams showing components of a display device according to an embodiment of the present disclosure.
Figure 20:
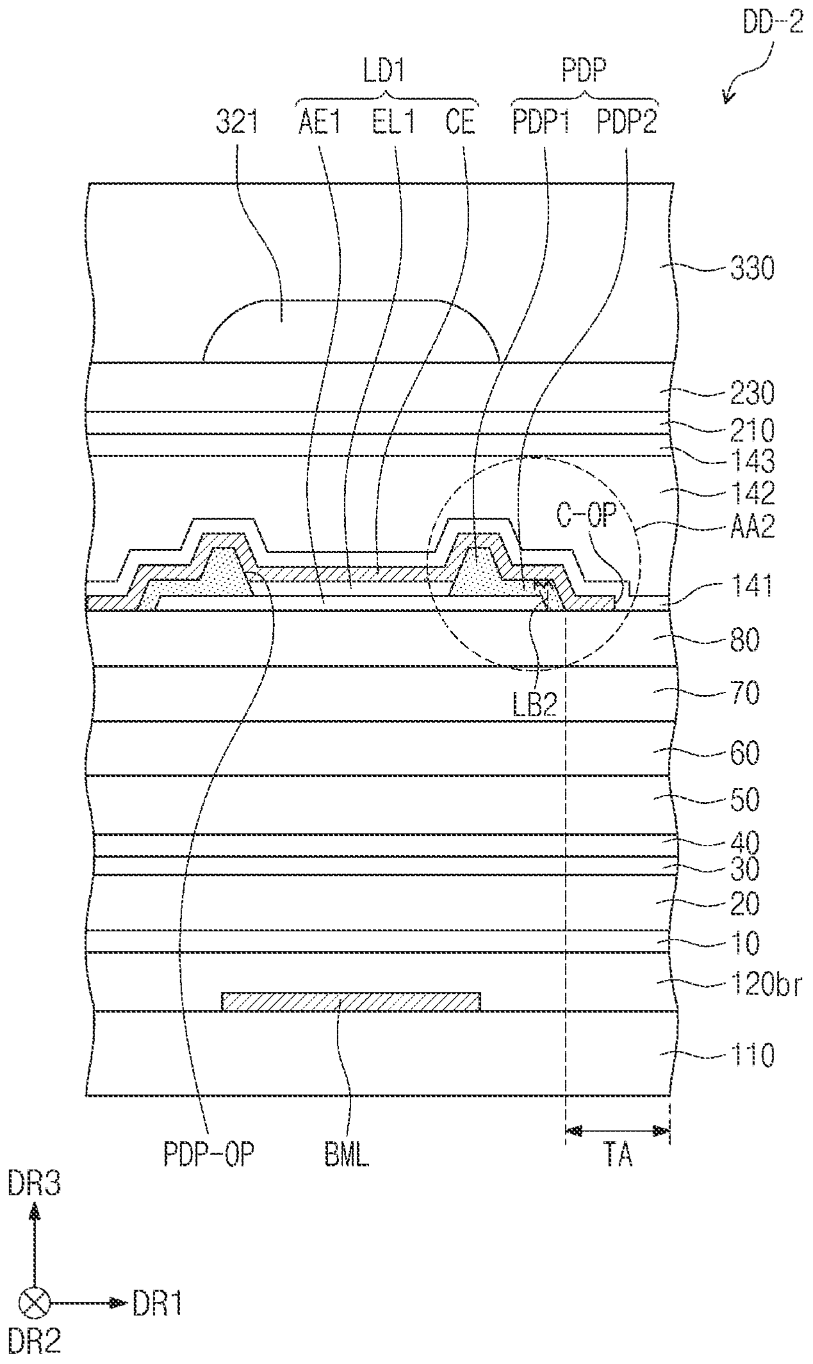
Figure 21:
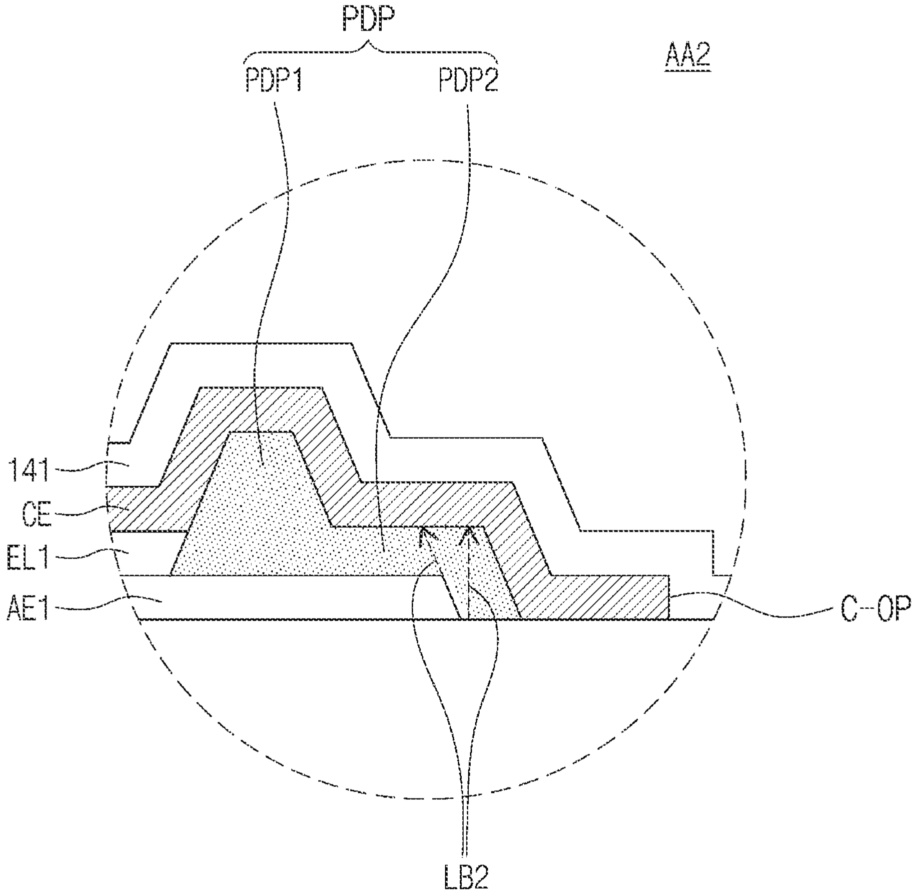

FIGS. 19, 20, 21, 22, and 24 depict, by way of example, cross-sections of display devices DD-1, DD-2, DD-3, and DD-4, which cross-sections correspond to a cross-section of one first emission element LD1. FIG. 21 shows an enlarged view of a second region AA2 depicted in FIG. 20, and FIG. 23 shows an enlarged view of a third region AA3 depicted in FIG. 22. The following description will focus on components of the display devices DD-1, DD-2, DD-3, and DD-4 depicted in FIGS. 19, 20, 22, and 24 different from components depicted in FIG. 12.

Referring to FIG. 19, the first pixel electrode AE1 of the first emission element LD1 included in the display device DD-1 may include a first sub-pixel electrode AE1-1 and a second sub-pixel electrode AE1-2. The first sub-pixel electrode AE1-1 may be disposed on the metal layer BML. The opening PDP-OP of the pixel definition pattern PDP may expose a portion of the first sub-pixel electrode AE1-1, and the first emission layer EL1 may be disposed on the first sub-pixel electrode AE1-1.

The second sub-pixel electrode AE1-2 may contact an edge of the first sub-pixel electrode AE1-1, and when viewed in plan, may outwardly extend beyond the metal layer BML. The second laser beam LB2 may be diffracted from an edge of the second sub-pixel electrode AE1-2.

Referring to FIGS. 20 and 21, the pixel definition pattern PDP of the display device DD-2 may include a first pixel definition pattern PDP1 and a second pixel definition pattern PDP2 that extends from the first pixel definition pattern PDP1. The first pixel definition pattern PDP1 may be disposed on a portion of the first pixel electrode AE1 adjacent to an edge of the first pixel electrode AE1.

The second pixel definition pattern PDP2 may extend from the first pixel definition pattern PDP1 toward the edge of the first pixel electrode AE1, thereby covering the edge of the first pixel electrode AE1. The second pixel definition pattern PDP2 may have a thickness in the third direction DR3 less than a thickness in the third direction DR3 of the first pixel definition pattern PDP1.

The common electrode CE may be irradiated with the second laser beam LB2 that is diffracted from the edge of the first pixel electrode AE1. As the second pixel definition pattern PDP2 has a small thickness, in the second pixel definition pattern PDP2, a small distance may be provided between the first pixel electrode AE1 and the common electrode CE. Therefore, in the second pixel definition pattern PDP2, there may be a reduction in irradiation area on the common electrode CE to which the second laser beam LB2 is irradiated.

Figure 22:
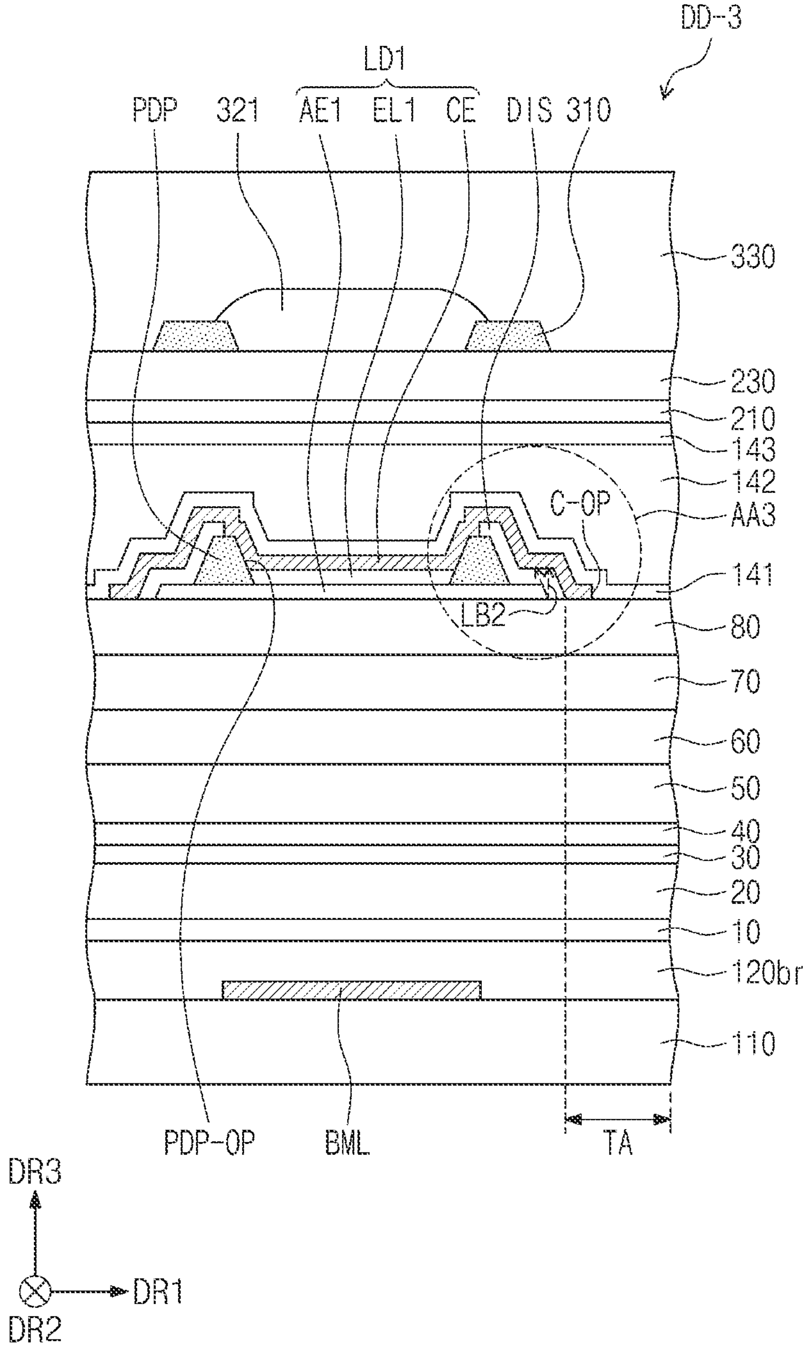
Figure 23:
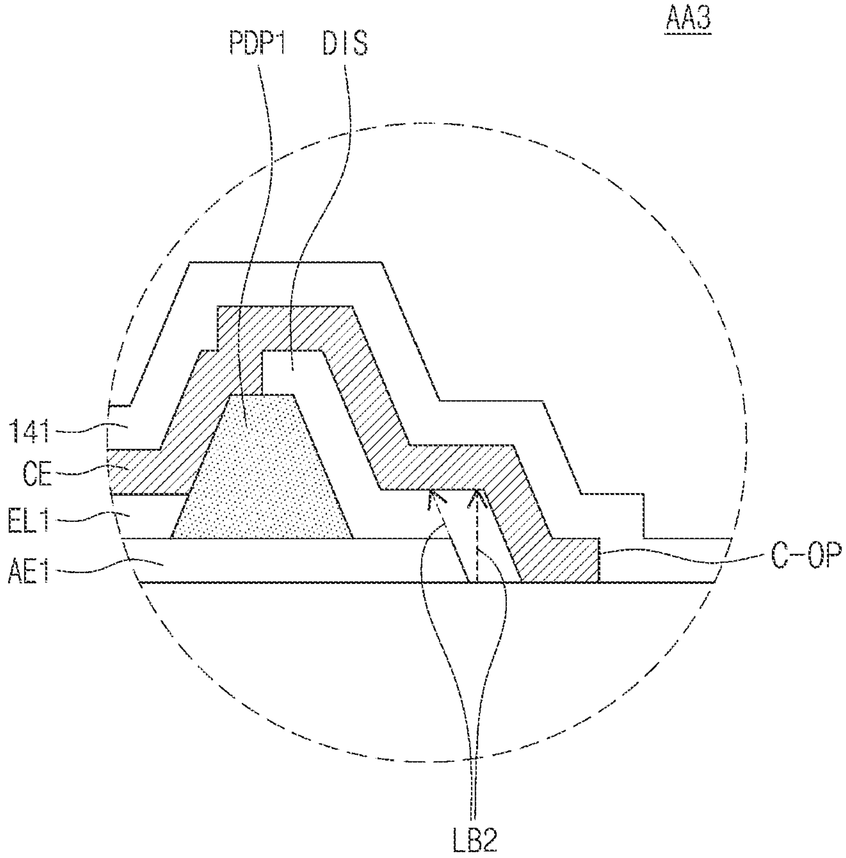

Referring to FIGS. 22 and 23, the pixel definition pattern PDP of the display device DD-3 may be disposed on a portion of the first pixel electrode AE1 adjacent to an edge of the first pixel electrode AE1.

The display device DD-3 may further include a dummy dielectric layer DIS. The dummy dielectric layer DIS may be disposed on the pixel definition pattern PDP, and may extend toward and cover the edge of the first pixel electrode AE1. The dummy dielectric layer DIS may have a thickness less than that of the pixel definition pattern PDP. The common electrode CE may be disposed on the pixel definition pattern PDP and the dummy dielectric layer DIS.

The common electrode CE may be irradiated with the second laser beam LB2 that is diffracted from the edge of the first pixel electrode AE1. As the dummy dielectric layer DIS has a small thickness, in the dummy dielectric layer DIS, a small distance may be provided between the first pixel electrode AE1 and the common electrode CE. Accordingly, in the dummy dielectric layer DIS, there may be a reduction in irradiation area on the common electrode CE to which the second laser beam LB2 is irradiated.

The black matrix 310 may be disposed on the pixel definition pattern PDP and the dummy dielectric layer DIS. In plan view, the black matrix 310 may overlap the pixel definition pattern PDP and the dummy dielectric layer DIS. The black matrix 310 may absorb and block external light that is reflected from a portion of the first pixel electrode AE1 that overlaps the dummy dielectric layer DIS.

Figure 24:
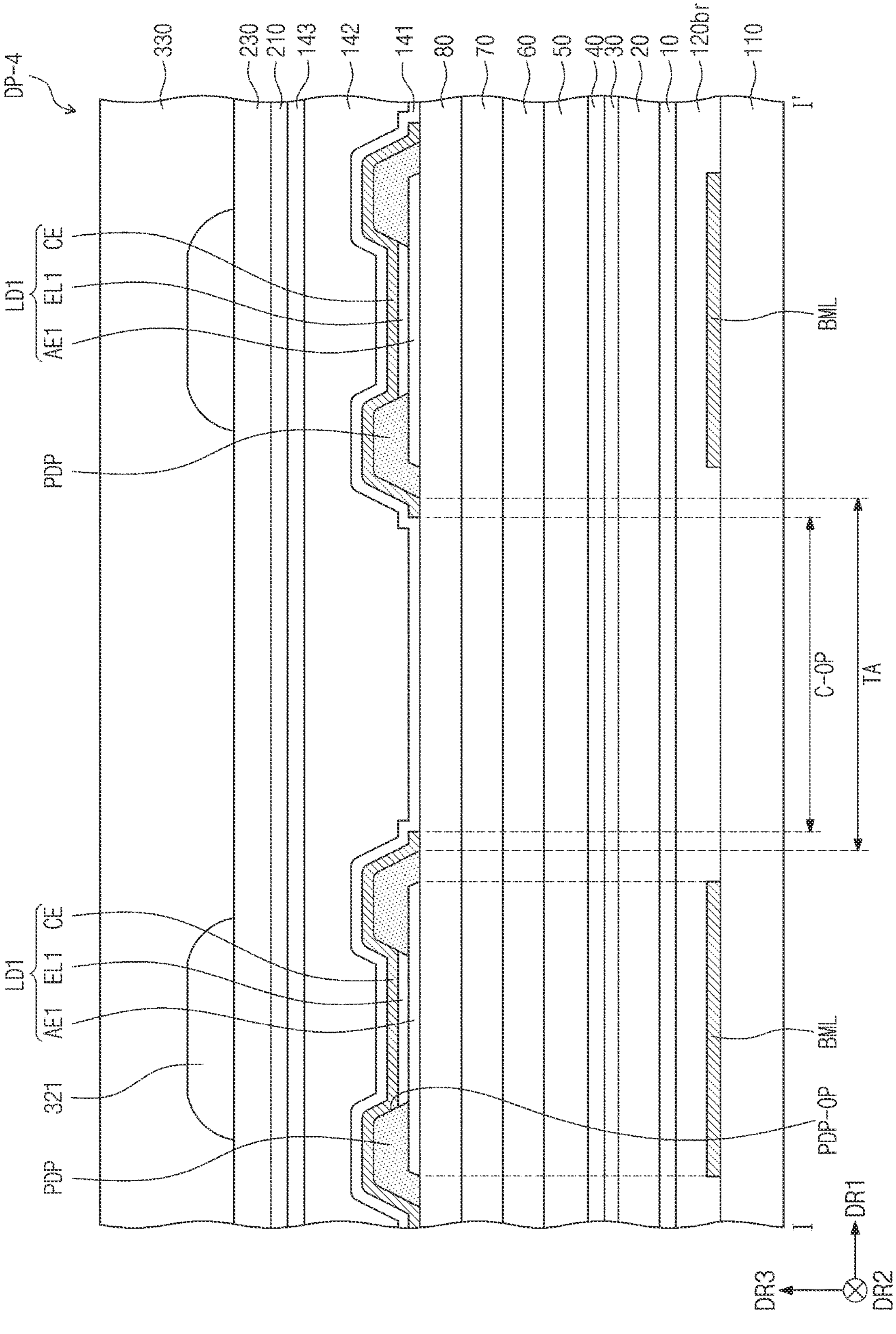

Referring to FIG. 24, differently from FIG. 12, the first pixel electrode AE1 may have a width greater than that of the metal layer BML. For example, as shown in FIGS. 12 and 24, the first pixel electrode AE1 may have a width the same as or greater than that of the metal layer BML.

According to an embodiment of the present disclosure, on a first region where an electronic module is disposed, a pixel electrode may have a width greater than that of a metal layer. In this case, in a process that forms an opening pattern of a common electrode, a laser beam may be diffracted from an edge of the pixel electrode and thus there may be a reduction in region of the laser beam provided to the common electrode on a pixel definition pattern. As a result, the common electrode may be prevented from being damaged, such that elements may be free of damage.

Although the present disclosure is described in conjunction with some example embodiments thereof, it would be understood by those skilled in the art that the present disclosure can be modified or changed in various ways without departing from spirit and scope of the present disclosure defined by the appended claims. Further, the embodiments disclosed herein are not intended to limit the technical spirit of the present disclosure and all technical spirit within the claims and their equivalents should be construed as being included in the present disclosure.

What is claimed is:

1. A display device, comprising a display panel that has a first region, a second region adjacent to the first region, and a third region adjacent to the second region, wherein the display panel includes:

a base layer;

a first pixel disposed on the base layer, the first pixel including a first emission element disposed in the first region and a first pixel circuit disposed in the second region, and the first pixel circuit being connected to the first emission element;

a metal layer disposed between the base layer and the first emission element;

a second pixel disposed on the second region; and a third pixel disposed on the third region, wherein the first emission element includes:

a first pixel electrode;

a first emission layer disposed on the first pixel electrode; and a common electrode disposed on the first emission layer, wherein the first pixel electrode extends beyond an edge of the metal layer.

2. The display device of claim 1 wherein, in plan view, the metal layer overlaps the first pixel electrode.

3. The display device of claim 1, wherein the common electrode is shared between the second and third pixels, wherein an opening is defined in the common electrode disposed in the first region.

4. The display device of claim 3, wherein the first pixel electrode is closer than the metal layer to the opening.

5. The display device of claim 1, wherein a width of the first emission layer is less than the width of the metal layer.

6. The display device of claim 5, wherein, in plan view, the first emission layer overlaps the metal layer.

7. The display device of claim 1, further comprising a pixel definition pattern that covers an edge of the first pixel electrode and has a ring shape in plan view, wherein the first emission layer is disposed in an opening of the pixel definition pattern, and wherein the common electrode is disposed on the pixel definition pattern.

8. The display device of claim 7, wherein, in plan view, an outer boundary of the first pixel electrode is between an outer boundary of the metal layer and an outer boundary of the pixel definition pattern.

9. The display device of claim 8, wherein the common electrode covers the pixel definition pattern and extends to an edge of an opening that is adjacent to the pixel definition pattern.

10. The display device of claim 1, wherein the second pixel includes:

a second emission element disposed on the second region; and a second pixel circuit disposed on the second region and connected to the second emission element, and wherein the third pixel includes:

a third emission element disposed on the third region; and a third pixel circuit disposed on the third region and connected to the third emission element.

11. The display device of claim 10, wherein an area of the first pixel electrode is greater than an area of a third pixel electrode.

12. The display device of claim 10, wherein an area of a second pixel electrode of the second emission element is greater than an area of a third pixel electrode of the third emission element.

13. The display device of claim 1, further comprising a connection line between the first pixel electrode and the metal layer on the first region to be connected to the first pixel, the connection line extending toward the second region to be connected to the first pixel circuit, wherein the connection line includes an optically transmissive material.

14. The display device of claim 1, further comprising a color filter disposed on the first emission element.

15. The display device of claim 1, wherein the first pixel electrode includes:

a first sub-pixel electrode disposed on the metal layer; and a second sub-pixel electrode in contact with an edge of the first sub-pixel electrode, the second sub-pixel electrode extending beyond the metal layer in plan view.

16. The display device of claim 1, further comprising:

a first pixel definition pattern disposed on a portion of the first pixel electrode that is adjacent to an edge of the first pixel electrode; and a second pixel definition pattern that extends from the first pixel definition pattern toward the edge of the first pixel electrode to cover the edge of the first pixel electrode, wherein the second pixel definition pattern has a thickness less than a thickness of the first definition pattern.

17. The display device of claim 1, further comprising:

a pixel definition pattern disposed on a portion of the first pixel electrode adjacent to an edge of the first pixel electrode; and a dummy dielectric layer disposed on the pixel definition pattern, the dummy dielectric layer extending toward the edge of the first pixel electrode to cover the edge of the first pixel electrode, wherein the dummy dielectric layer has a thickness less than a thickness of the pixel definition pattern.

18. The display device of claim 17, further comprising a black matrix disposed on the pixel definition pattern and the dummy dielectric layer, the black matrix overlapping the pixel definition pattern and the dummy dielectric layer.

19. A display device, comprising a display panel that has a first region, a second region adjacent to the first region, and a third region adjacent to the second region, wherein the display panel includes:

a base layer;

a first pixel disposed on the base layer, the first pixel including a first emission element disposed on the first region and a first pixel circuit disposed on the second region, and the first pixel circuit being connected to the first emission element;

a metal layer disposed between the base layer and the first emission element;

a second pixel disposed on the second region; and a third pixel disposed on the third region, wherein the first emission element includes:

a first pixel electrode;

a first emission layer disposed on the first pixel electrode; and a common electrode disposed on the first emission layer, wherein an opening is defined in the common electrode, wherein the first pixel electrode is closer than the metal layer to the opening.

20. A display device, comprising;

a base layer comprising a first region, a second region surrounding the first region, and a third region surrounding the second region;

a first pixel disposed on the base layer, the first pixel including a first emission element disposed in the first region and a first pixel circuit disposed in the second region, and the first pixel circuit being electrically connected to the first emission element and including a semiconductor pattern;

a second pixel disposed on the base layer, the second pixel including a second emission element disposed in the second region and a second pixel circuit disposed in the second region, and the second pixel circuit being electrically connected to the second emission element;

a third pixel disposed on the base layer, the third pixel including a third emission element disposed in the third region and a third pixel circuit disposed in the third region, and the third pixel circuit being electrically connected to the third emission element; and a metal layer disposed between the baser layer and the semiconductor pattern, wherein an optical transmittance of the first region is greater than an optical transmittance of the third region;

wherein the first emission element includes a first pixel electrode, a first emission layer disposed on the first pixel electrode and a common electrode disposed on the first emission layer; and wherein the first pixel electrode extends beyond an edge of the metal layer.

* * * * *